United States Patent
Bassov et al.

(10) Patent No.: US 11,372,579 B2
(45) Date of Patent: Jun. 28, 2022

(54) TECHNIQUES FOR GENERATING DATA SETS WITH SPECIFIED COMPRESSION AND DEDUPLICATION RATIOS

(71) Applicant: EMC IP Holding Company LLC, Hopkinton, MA (US)

(72) Inventors: Ivan Bassov, Brookline, MA (US); Istvan Gonczi, Berkley, MA (US); Sorin Faibish, Newton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/077,632

(22) Filed: Oct. 22, 2020

(65) Prior Publication Data

US 2022/0129190 A1 Apr. 28, 2022

(51) Int. Cl.
*G06F 3/06* (2006.01)
*H03M 7/30* (2006.01)

(52) U.S. Cl.
CPC .......... *G06F 3/0656* (2013.01); *G06F 3/067* (2013.01); *G06F 3/0608* (2013.01); *G06F 3/0641* (2013.01); *G06F 3/0683* (2013.01); *H03M 7/3091* (2013.01)

(58) Field of Classification Search
CPC .... G06F 3/0656; G06F 3/0608; G06F 3/0683; G06F 3/0641; G06F 3/067; H03M 7/3091
See application file for complete search history.

(56) References Cited

U.S. PATENT DOCUMENTS

| | | | | |
|---|---|---|---|---|
| 6,348,881 B1 * | 2/2002 | Buer | ................... | H03M 7/3084 |
| | | | | 375/240 |
| 7,079,051 B2 * | 7/2006 | Storer | ..................... | H03M 7/30 |
| | | | | 341/51 |
| 8,429,359 B1 * | 4/2013 | Desai | .................. | G06F 11/1461 |
| | | | | 711/E12.103 |

(Continued)

OTHER PUBLICATIONS

Microsoft, "Computer Dictionary", Fifth Edition, 2002, pp. 76 and 144 (Year: 2002).*

(Continued)

*Primary Examiner* — Christopher D Birkhimer
(74) *Attorney, Agent, or Firm* — Muirhead and Saturnelli, LLC

(57) ABSTRACT

Techniques for generating data sets may include: receiving an initial buffer that achieves a compression ratio responsive to compression processing using a compression algorithm, the initial buffer including first content located at a first position in the initial buffer and including second content located at a second position in the initial buffer; and generating a data set of buffers using the initial buffer. The data set may be expected to achieve a specified deduplication ratio responsive to deduplication processing and to achieve the compression ratio responsive to compression processing using the compression algorithm. Generating the data set may include generating a first plurality of buffers where each buffer of the first plurality is not a duplicate of another buffer in the first plurality, and generating a second plurality of duplicate buffers. Each duplicate buffer may be a duplicate of a buffer in the first plurality of buffers.

21 Claims, 9 Drawing Sheets

(56) References Cited

U.S. PATENT DOCUMENTS

| | | | | |
|---|---|---|---|---|
| 8,538,919 | B1* | 9/2013 | Nielsen | H04L 63/0272 |
| | | | | 718/1 |
| 8,593,678 | B2* | 11/2013 | Ohishi | H04N 1/2166 |
| | | | | 358/1.15 |
| 8,732,403 | B1* | 5/2014 | Nayak | G06F 3/0619 |
| | | | | 711/170 |
| 9,075,705 | B2* | 7/2015 | Hikichi | G06F 11/004 |
| 9,092,182 | B2* | 7/2015 | Ohishi | H04N 1/00944 |
| 9,344,596 | B2* | 5/2016 | Ohishi | H04N 1/00973 |
| 9,715,434 | B1* | 7/2017 | Xu | G06F 3/067 |
| 9,800,291 | B1* | 10/2017 | Ben David | G06F 3/0605 |
| 9,817,602 | B2* | 11/2017 | Chaw | G06F 3/0641 |
| 10,042,785 | B1* | 8/2018 | Buch | G06F 3/0674 |
| 10,108,543 | B1* | 10/2018 | Duggal | G06F 11/1453 |
| 10,108,544 | B1* | 10/2018 | Duggal | G06F 11/14 |
| 10,289,333 | B2* | 5/2019 | Sundrani | G06F 3/0659 |
| 10,521,122 | B2* | 12/2019 | Abe | G06F 3/0653 |
| 10,592,150 | B2* | 3/2020 | Sakamoto | G06F 3/0608 |
| 10,795,812 | B1* | 10/2020 | Duggal | G06F 3/067 |
| 2004/0117414 | A1* | 6/2004 | Braun | G06F 8/65 |
| 2005/0154805 | A1* | 7/2005 | Steely, Jr. | G06F 9/30181 |
| | | | | 712/E9.046 |
| 2006/0005074 | A1* | 1/2006 | Yanai | G06F 3/0619 |
| | | | | 714/6.32 |
| 2008/0140902 | A1* | 6/2008 | Townsend | H04B 1/0475 |
| | | | | 710/306 |
| 2008/0144079 | A1* | 6/2008 | Pandey | H03M 7/30 |
| | | | | 358/1.15 |
| 2008/0307020 | A1* | 12/2008 | Ko | G06F 21/6245 |
| 2010/0077013 | A1* | 3/2010 | Clements | G06F 16/1748 |
| | | | | 707/822 |
| 2010/0088296 | A1* | 4/2010 | Periyagaram | G06F 3/0641 |
| | | | | 707/E17.014 |
| 2010/0174881 | A1* | 7/2010 | Anglin | G06F 11/1453 |
| | | | | 711/E12.103 |
| 2010/0281081 | A1* | 11/2010 | Stager | G06F 9/5022 |
| | | | | 707/814 |
| 2010/0333116 | A1* | 12/2010 | Prahlad | G06F 3/0631 |
| | | | | 713/153 |
| 2011/0236049 | A1* | 9/2011 | Haga | G03G 15/5004 |
| | | | | 399/75 |
| 2013/0024423 | A1* | 1/2013 | Doshi | G06F 11/1448 |
| | | | | 707/640 |
| 2013/0173554 | A1* | 7/2013 | Ubukata | G06F 11/2094 |
| | | | | 707/640 |
| 2014/0143517 | A1* | 5/2014 | Jin | G06F 3/067 |
| | | | | 711/171 |
| 2015/0205816 | A1* | 7/2015 | Periyagaram | G06F 16/183 |
| | | | | 707/827 |
| 2015/0261776 | A1* | 9/2015 | Attarde | G06F 16/1748 |
| | | | | 707/664 |
| 2016/0139849 | A1* | 5/2016 | Chaw | G06F 3/0611 |
| | | | | 711/119 |
| 2016/0350324 | A1* | 12/2016 | Wang | G06F 16/137 |
| 2017/0132082 | A1* | 5/2017 | Resch | G06F 3/067 |
| 2018/0253253 | A1* | 9/2018 | Sakamoto | G06F 3/0673 |
| 2018/0314727 | A1* | 11/2018 | Epstein | G06N 5/003 |
| 2018/0364935 | A1* | 12/2018 | Sundrani | G06F 3/0604 |
| 2019/0235755 | A1* | 8/2019 | Abe | G06F 3/0673 |
| 2020/0042475 | A1* | 2/2020 | Venkataramani | G06F 3/0665 |
| 2020/0125290 | A1* | 4/2020 | Shah | G06F 3/0679 |
| 2020/0310686 | A1* | 10/2020 | Truong | G06F 3/067 |
| 2021/0374021 | A1* | 12/2021 | Santhakumar | G06N 3/08 |

OTHER PUBLICATIONS

Paul Crocetti, "data deduplication ratio", Mar. 2016, pp. 1-3, https://www.techtarget.com/searchdatabackup/definition/data-deduplication-ratio (Year: 2016).*

Computer Hope, "Buffer", Mar. 1, 2018, pp. 1, https://www.computerhope.eom/jargon/b/buffer.htm (Year: 2018).*

Dinesh Thakur, "What is buffer?", Jul. 13, 2014, pp. 1-6, https://web.archive.org/web/20140713114237/https://ecomputernotes.com/fundamental/input-output-and-memory/buffer (Year: 2014).*

Anonymous, "buffer", Apr. 2005, pp. 1-2, https://whatis.techtarget.com/definition/buffer (Year: 2005).*

PC Mag, "buffer", Jul. 15, 2020, pp. 1-3, https://web.archive.org/web/20200715093037/https://www.pcmag.com/encyclopedia/term/buffer (Year: 2020).*

TechTerms.com, "Buffer", 2006, 1-4, https://techterms.com/definition/buffer (Year: 2006).*

Henk Vandenbergh, "Vdbench Users Guide," Version 5.03, Oct. 2012.

* cited by examiner

TECHNIQUES FOR GENERATING DATA SETS WITH SPECIFIED COMPRESSION AND DEDUPLICATION RATIOS

BACKGROUND

Technical Field

This application generally relates to data processing.

Description of Related Art

Systems may include different resources used by one or more host processors. The resources and the host processors in the system may be interconnected by one or more communication connections, such as network connections. These resources may include data storage devices such as those included in data storage systems. The data storage systems may be coupled to one or more host processors and provide storage services to each host processor. Multiple data storage systems from one or more different vendors may be connected and may provide common data storage for the one or more host processors.

A host may perform a variety of data processing tasks and operations using the data storage system. For example, a host may issue I/O operations, such as data read and write operations, received at a data storage system. The host systems may store and retrieve data by issuing the I/O operations to the data storage system containing a plurality of host interface units, disk drives (or more generally storage devices), and disk interface units. The host systems access the storage devices through a plurality of channels provided therewith. The host systems provide data and access control information through the channels to a storage device of the data storage system. Data stored on the storage device may also be provided from the data storage system to the host systems also through the channels. The host systems do not address the storage devices of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

Various embodiments of the techniques herein may include a method, a system and a computer readable medium for generating data sets that may be used for testing, wherein the techniques comprise: receiving an initial buffer that achieves a first compression ratio responsive to compression processing using a compression algorithm, the initial buffer including first content located at a first position in the initial buffer and including second content located at a second position in the initial buffer; and generating a data set of buffers using the initial buffer, wherein the data set is expected to achieve a specified deduplication ratio responsive to deduplication processing and is expected to achieve the first compression ratio responsive to compression processing using the same compression algorithm, wherein said generating the data set includes: generating a first plurality of buffers of the data set, wherein each of the first plurality of buffers is not a duplicate of another buffer in the first plurality, wherein a counter associated with the initial buffer is set to a first value and the first value is stored at the first position in a first buffer of the first plurality, and wherein the second content of the initial buffer is stored at the second position in the first buffer; and generating a second plurality of duplicate buffers of the data set, wherein each duplicate buffer of the second plurality is a duplicate of one of the first plurality of buffers of the data set, wherein a data value stored at the first position of a first duplicate buffer of the second plurality is included in a range of prior counter values of the counter, and wherein each prior counter value in the range is stored at the first position in a different one of the first plurality of buffers.

In at least one embodiment, the range of prior counter values may be from zero (0) to the first value, inclusively. A total data reduction ratio of the data set as a result of deduplication processing and compression processing using the compression algorithm may approximate (e.g., within expected tolerances or limits) a mathematical product of the specified deduplication ratio multiplied by the first compression ratio. A first number of duplicate buffers in the data set may be in accordance with the specified deduplication ratio, and wherein the second plurality of duplicate buffers includes the first number of duplicate buffers. The data set may include N buffers, wherein the specified deduplication ratio may denote a percentage of the N buffers of the data set that are duplicates. The percentage of N may be equal to the first number, wherein a second number may be equal to the difference between N and the first number, and wherein the second number may denote how many of the N buffers are included in the first plurality of buffers. The data value stored at the first position of a first duplicate buffer of the second plurality may be randomly selected from the range of prior counter values of the counter. The data value may be selected using a pseudo-random number generator. When a pseudo-random number generator is used, at least one embodiment may restrict the range of random numbers generated, for example, to be 1 . . . K, where K is chosen at a point in time P, K is less than L, and L denotes the number of unique buffers generated at another point in time prior to the point in time P. The first position of each buffer in the data set may correspond to a plurality of bytes at a selected offset of said each buffer. For example, the first position of each buffer in the data set may correspond to 8 bytes located at a beginning of each buffer. In this case, the selected offset corresponding to the starting offset within the buffer may be offset zero (0). More generally, the starting offset may be any selected valid offset within the buffer so long as the same starting offset is used with each buffer.

In at least one embodiment, generating the first plurality of buffers may include: after generating the first buffer of the first plurality, incrementing the counter by one from the first value to a second value; generating a second buffer of the first plurality, wherein the second value of the counter associated with the initial buffer is stored at the first position in the second buffer of the first plurality, and wherein the second content of the initial buffer is stored at the second position in the second buffer; after generating the second buffer of the first plurality, incrementing the counter by one from the second value to a third value; and generating a third buffer of the first plurality, wherein the third value of the counter associated with the initial buffer is stored at the first position in the third buffer of the first plurality, and wherein the second content of the initial buffer is stored at the second position in the third buffer. The initial buffer may be a first initial buffer of a first plurality of initial buffers associated with the compression algorithm, and wherein the first plurality of initial buffers may be generated to yield a first degree of compression responsive to compression processing using the compression algorithm. A second plurality of initial buffers may be generated to yield a different degree of compression using the same compression algorithm.

In at least one embodiment as described herein using an 8 byte time stamp that is inserted into each of the generated buffers, the 8 byte time stamp may be characterized as small enough not to alter the desired compressibility of the buffer generated. In such an embodiment, the 8 byte time stamp may be altered or varied to achieve a desired degree of deduplication. Whether the 8 byte time stamp of a generated buffer is unique or a randomly selected repeated value may thus be used to control the extent of deduplication independently of the compressibility of the generated buffers. An embodiment in accordance with the techniques herein may control the compressibility of generated data buffers in an independent manner by first generating the content of a data buffer with a desired compression ratio, and then modifying the content of the data buffer to include an 8 byte time stamp that is either unique or a randomly selected repeated value.

In at least one embodiment, each buffer in the data set is a same size. The same size may be a value that is at least 4K bytes and wherein the first position of each buffer of the data set may correspond to a same 8 byte region at one end of said each buffer. In such an embodiment, a starting offset of 0 may be used for the 8 byte region. However, more generally, any suitable values for the starting offset may be used so long as the starting offset is the same in all buffers. The method may include generating a resulting data set as a result of performing data deduplication processing and compression processing with the compression algorithm on the data set; and verifying that the total data reduction ratio is achieved with respect to the resulting data set and the data set.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
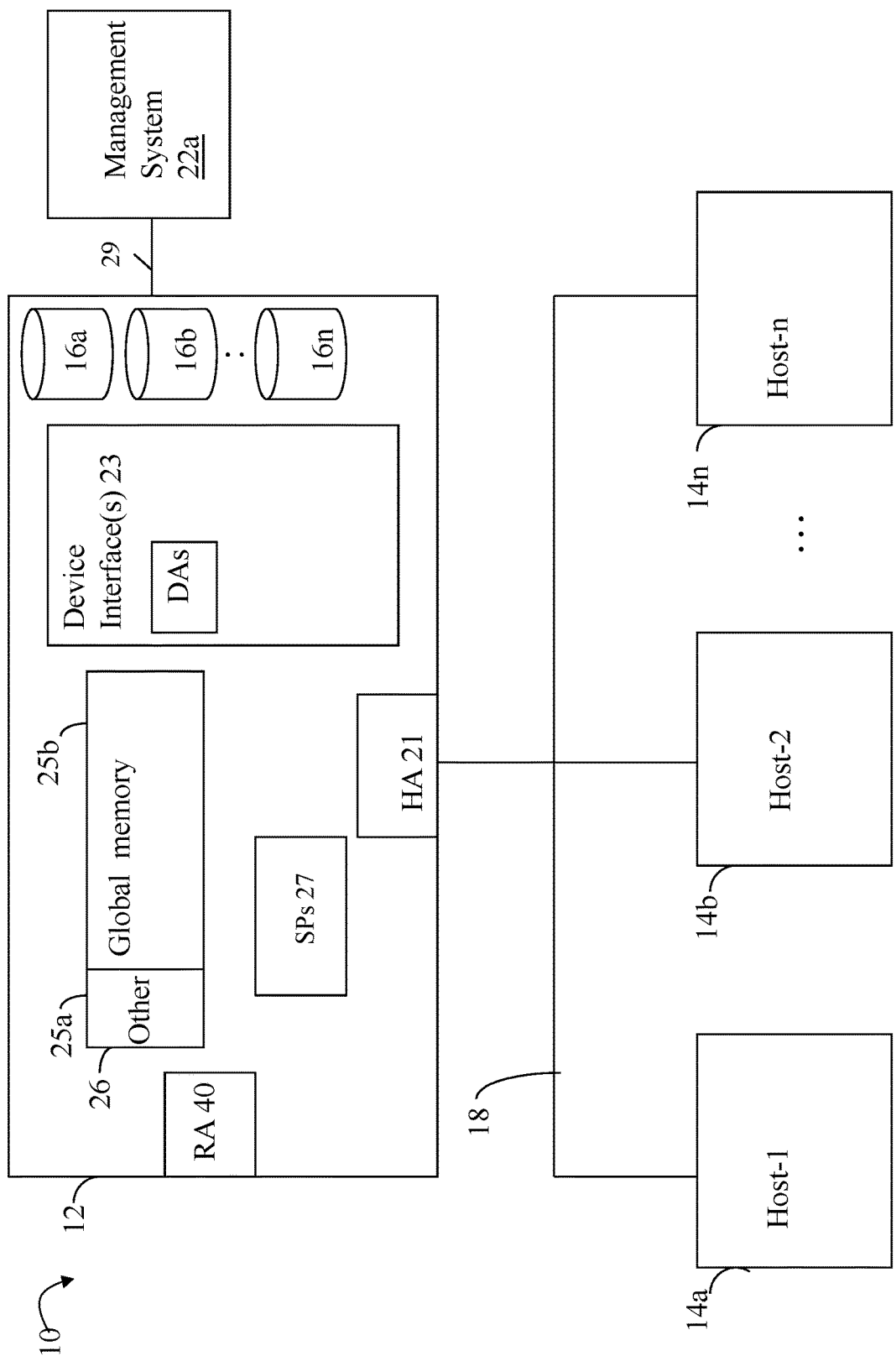
FIG. 1 is an example of components that may be included in a system in accordance with the techniques described herein.

Referring to the FIG. 1, shown is an example of an embodiment of a system 10 that may be used in connection with performing the techniques described herein. The system 10 includes a data storage system 12 connected to the host systems (also sometimes referred to as hosts) 14a-14n through the communication medium 18. In this embodiment of the system 10, the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host systems 14a-14n and data storage system 12 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the hosts 14a-14n and the data storage system 12 may all be located at the same physical site, or, alternatively, may also be located in different physical locations. The communication medium 18 used for communication between the host systems 14a-14n and the data storage system 12 of the system 10 may use a variety of different communication protocols such as block-based protocols (e.g., SCSI, Fibre Channel, iSCSI), file system-based protocols (e.g., NFS or network file server), and the like. Some or all of the connections by which the hosts 14a-14n and the data storage system 12 may be connected to the communication medium 18 may pass through other communication devices, such as switching equipment, a phone line, a repeater, a multiplexer or even a satellite.

Each of the host systems 14a-14n may perform data operations. In the embodiment of the FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although the element 12 is illustrated as a single data storage system, such as a single data storage array, the element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrating the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices (PDs) 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. SSDs may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single level cell) devices and/or MLC (multi level cell) devices.

The data storage array may also include different types of adapters or directors, such as an HA 21 (host adapter), RA 40 (remote adapter), and/or device interface(s) 23. Each of the adapters may be implemented using hardware including a processor with a local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from one of the hosts 14a-n. The data storage array may include one or more RAs that may be used, for example, to facilitate communications between data storage arrays. The data storage array may also include one or more device interfaces 23 for facilitating data transfers to/from the data storage devices 16a-16n. The data storage device interfaces 23 may include device interface modules, for example, one or more disk adapters (DAs) (e.g., disk controllers) for interfacing with the flash drives or other physical storage devices (e.g., PDS 16a-n). The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, the HAs and/or the RAs in a data storage array. In one embodiment, the device interfaces 23 may perform data operations using a system cache that may be included in the global memory 25b, for example, when communicating with other device interfaces and other components of the data storage array. The other portion 25a is that portion of the memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

The host systems 14a-14n provide data and access control information through channels to the storage systems 12, and the storage systems 12 may also provide data to the host systems 14a-n also through the channels. The host systems 14a-n do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of storage space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may include one or more type of device interface used in connection with facilitating data transfers to/from the associated disk drive(s) and LUN (s) residing thereon. For example, such device interfaces may include a device interface used in connection with facilitating data transfers to/from the associated flash devices and LUN(s) residing thereon. It should be noted that an embodiment may use the same or a different device interface for one or more different types of devices than as described herein.

In an embodiment in accordance with the techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of the techniques herein may be made with respect to a physical data storage system and its physical components (e.g., physical hardware for each HA, DA, HA port and the like), the techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in the FIG. 1 is a management system 22a that may be used to manage and monitor the data storage system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

Information regarding the data storage system configuration may be stored in any suitable data container, such as a database. The data storage system configuration information stored in the database may generally describe the various physical and logical entities in the current data storage system configuration. The data storage system configuration information may describe, for example, the LUNs configured in the system, properties and status information of the configured LUNs (e.g., LUN storage capacity, unused or available storage capacity of a LUN, consumed or used capacity of a LUN), configured RAID groups, properties and status information of the configured RAID groups (e.g., the RAID level of a RAID group, the particular PDs that are members of the configured RAID group), the PDs in the system, properties and status information about the PDs in the system, local replication configurations and details of existing local replicas (e.g., a schedule or other trigger conditions of when a snapshot is taken of one or more LUNs, identify information regarding existing snapshots for a particular LUN), remote replication configurations (e.g., for a particular LUN on the local data storage system, identify the LUN's corresponding remote counterpart LUN and the remote data storage system on which the remote LUN is located), data storage system performance information such as regarding various storage objects and other entities in the system, and the like.

Consistent with other discussion herein, management commands issued over the control or data path may include commands that query or read selected portions of the data storage system configuration, such as information regarding the properties or attributes of one or more LUNs. The management commands may also include commands that write, update, or modify the data storage system configuration, such as, for example, to create or provision a new LUN (e.g., which may result in modifying one or more database tables such as to add information for the new LUN), to modify an existing replication schedule or configuration (e.g., which may result in updating existing information in one or more database tables for the current replication schedule or configuration), to delete a LUN (e.g., which may include deleting the LUN from a table of defined LUNs and may also include modifying one or more other database tables to delete any existing snapshots of the LUN being deleted), and the like.

It should be noted that each of the different adapters, such as each HA, DA, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of the FIG. 1 may be a data storage system, such as a data storage array, that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, the memory 26 may represent memory of each such storage processor.

Generally, the techniques herein may be used in connection with any suitable storage system, appliance, device, and the like, in which data is stored. For example, an embodiment may implement the techniques herein using a midrange data storage system, such as a Dell EMC Unity® data storage system, as well as a high end or enterprise data storage system, such as a Dell EMC™ PowerMAX™ data storage system or a Dell EMC™ PowerStore™ data storage system. In at least some data storage systems such as the Dell EMC™ PowerStore™ data storage systems, the various components, such as the DA, FA, RA, and the like, as described above, may not be individual hardware components but may rather represent functionality performed by nodes of the data storage system. Additional details regarding such an embodiment with nodes performing processing of multiple components such as the DAs, FAs, and the like, are described in the following paragraphs.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receive a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to the FIG. 1, the control commands may be issued from data storage management software executing on management system 22a to the data storage system 12. Such commands may be, for example, to establish or modify data services, provision storage, perform user account management, and the like. Consistent with other discussion herein, the management commands may result in processing that includes reading and/or modifying information in the database storing data storage system configuration information. For example, management commands that read and/or modify the data storage system configuration information in the database may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to the FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with the techniques herein may perform different data processing operations or services on data stored on the data storage system. For example, the data storage system may perform one or more data reduction operations, such as data deduplication and data compression. Such data reduction operations attempt to reduce the amount of storage needed for storing data on non-volatile backend storage devices (e.g., PDs) with the goal of reducing the cost per unit of storage consumed (e.g., dollar cost per GB of storage). Generally, data deduplication techniques are known in the art and any suitable such technique may be used in an embodiment in accordance with the techniques herein. In at least one embodiment in accordance with the techniques herein, data deduplication processing performed may include digest or hash value computation using an algorithm such as based on the SHA-256 cryptographic hashing algorithm known in the art. Data deduplication generally refers to removing redundant or duplicate data portions. Data deduplication techniques may include looking for duplicate data blocks whereby only a single instance of the data block is retained (stored on physical storage) and where pointers or references may be used in connection with duplicate or redundant copies (which reference or identify the single stored instance of the data block).

Figure 2A:
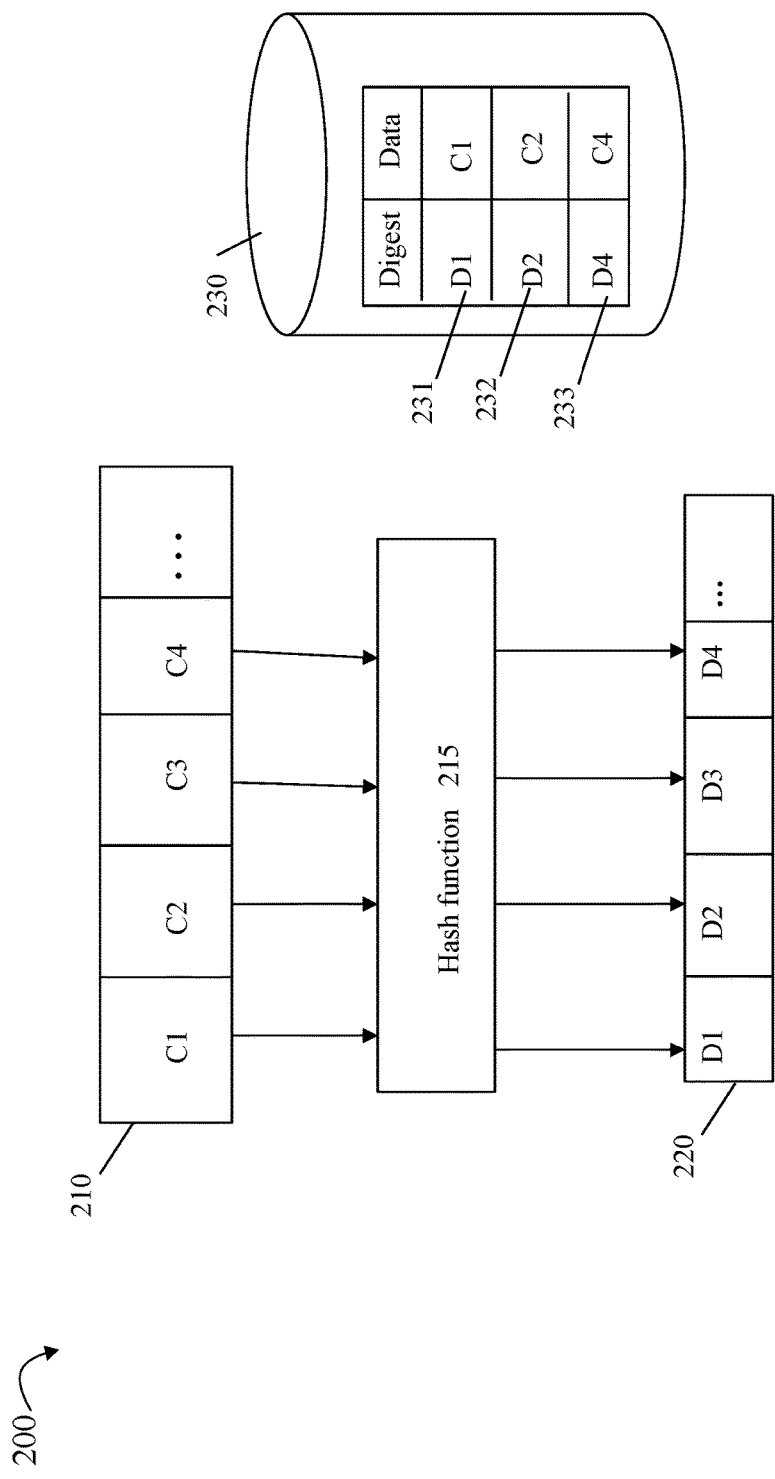
FIG. 2A is an example illustrating data deduplication as may be performed in an embodiment in accordance with the techniques herein.

Referring to the FIG. 2A, shown is an example 200 illustrating processing that may be performed in connection with data deduplication processing in an embodiment in accordance with the techniques herein. The element 210 may denote the original data being written or stored on back-end non-volatile storage. The original data may be partitioned into multiple data blocks C1, C2, C3, C4 and the like. In at least one embodiment and for purposes of illustration, the data blocks may all be the same size where the size may vary with embodiment. Each block is provided as an input to hash function 215. As noted above, in at least one embodiment, the hash function 215 may be the SHA-256 hashing algorithm, or more generally, any suitable cryptographic, or non-cryptographic hashing function known in the art. For each block of 210, the hash function 215 may perform processing and generate, as an output, a hash value, hash or digest derived from the block 210. The element 220 includes hashes D1, D2, D3, D4, and the like, where a corresponding different one of the hashes DN is generated for each one of the blocks CN (where "N" is an integer denoting the block and associated hash value generated for that block). For example, D1 is the hash generated for C1, D2 is the hash generated for C2, D3 is the hash generated for C3, and so on. Generally, a hash function 215 is selected which has an acceptably low probability of a "hash collision" of generating the same digest or hash value for two different blocks. The strength of the hash function 215 may be measured by the unlikelihood of a collision occurring where two different input blocks of data produce the same hash. The strength increases with the bit length of the hash value, hash or digest. Thus, if two blocks, such as C1 and C3, have the same hashes whereby D1=D3, then blocks C1 and C3 match (e.g., are identical matching data blocks). If two blocks, such as C1 and C4, have different hashes whereby D1 does not equal D4, then blocks C1 and C4 do not match (e.g., are different or non-matching data blocks). In cases where two matching or identical blocks have the same hash, only a single copy of the data block is stored on backend non-volatile physical storage of the data storage system. The single stored instance of the data block may be referenced using a pointer, handle, the hash of the block, and the like.

The element 230 of the FIG. 2A may denote the data store, such as a data base (DB) used to store data blocks. In this example, as noted above, assume blocks C1 and C3 are the same with remaining blocks C2 and C4 being unique. In at least one embodiment, the data store 230 may be organized and managed using a data structure, such as a hash table. In at least one embodiment, computed hashes, or portions thereof, may be used as an index into the hash table where the single unique instances of data blocks may be stored (along with other metadata as may be needed for maintaining the table and also in accordance with the particular hash table management used in an embodiment). Hash tables are data structures known in the art. A hash table uses a hash function to compute an index into an array of buckets or slots, from which the desired data can be found. In this example, the block of data may be mapped by hash function 215, and thus by the block's hash, to a particular entry in the table at which the block of data is stored. To further illustrate, the hash function 215 may be used to generate a hash value, hash or digest for a particular data block. The hash is then further mapped (e.g., such as by another mathematical function, using particular portions of the hash, and the like) to a particular index or entry of the hash table. The particular mapping used to map the hash to a corresponding table entry varies, for example, with the hash and the size of hash table.

When storing a new data block, such as C1, its hash may be mapped to a particular hash table entry 231 whereby if the table entry is null/empty, or otherwise does not already include a data block matching C1, then C1 is stored in the table entry along with its associated hash D1 (this is the first time block C1 is recorded in the data store 230). Otherwise, if there is already an existing entry in the table including a data block matching C1, it indicates that the new data block is a duplicate of an existing block. In this example as noted above, processing is performed for C1, C2, and C4 respectively, where entries 231, 232, and 233 are added since there are no existing matching entries in the hash table. When processing block C3, as noted above, C3 has a hash D3 matching D1 whereby C3 (and thus D3) maps to entry 231 of the hash table already including a matching block C1 (so no additional data block is added to 230 for C3 since C3 is determined as a duplicate of C1). In connection with representing a particular file or other storage entity including multiple duplicate occurrences of a particular block such as C3, the single instance or copy of the data may be stored in 230. Additionally, a handle or reference, such as identifying the hash table entry 231, its hash, and the like, may be used to reference the single instance or copy of the data storage in 230. When reconstructing or restoring data to its original form, the handle or reference into the hash table for block C3 may be used to obtain the actual block C3 of data from 230.

Figure 2B:
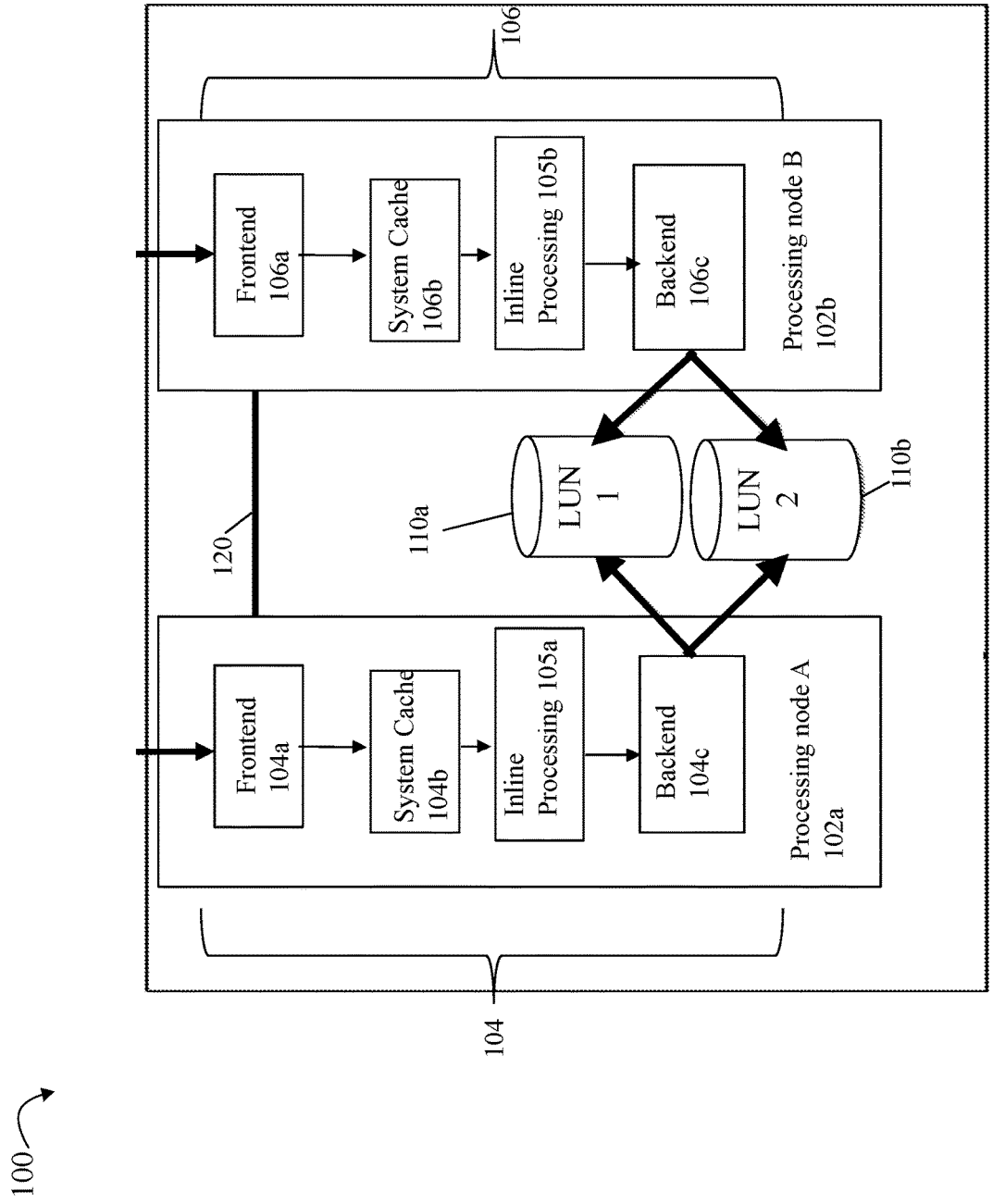
FIG. 2B is an example illustrating the I/O path or data path in connection with processing data in an embodiment in accordance with the techniques herein.

With reference to the FIG. 2B, shown is an example 100 illustrating components that may be included in the data path in at least one existing data storage system in accordance with the techniques herein. The example 100 includes two processing nodes A 102a and B 102b and the associated software stacks 104, 106 of the data path, where I/O requests may be received by either processing node 102a or 102b. In the example 200, the data path 104 of processing node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and non-volatile physical storage (e.g., back end physical non-volatile storage devices or PDs accessed by BE components such as DAs as described herein). During movement of data in and out of the system cache layer 104b (e.g., such as in connection with read data from, and writing data to, physical storage 110a, 110b), inline processing may be performed by layer 105a. Such inline processing operations of 105a may be optionally performed and may include any one of more data processing operations in connection with data that is flushed from system cache layer 104b to the back-end non-volatile physical storage 110a, 110b, as well as when retrieving data from the back-end non-volatile physical storage 110a, 110b to be stored in the system cache layer 104b. In at least one embodiment, the inline processing may include, for example, performing one or more data reduction operations such as data duplication or data compression. The inline processing may include performing any suitable or desirable data processing operations as part of the I/O or data path.

In a manner similar to that as described for data path 104, the data path 106 for processing node B 102b has its own FE component 106a, system cache layer 106b, inline processing layer 105b, and BE component 106c that are respectively similar to the components 104a, 104b, 105a and 104c. The elements 110a, 110b denote the non-volatile BE physical storage provisioned from PDs for the LUNs, whereby an I/O may be directed to a location or logical address of a LUN and where data may be read from, or written to, the logical address. The LUNs 110a, 110b are examples of storage objects representing logical storage entities included in an existing data storage system configuration. Since, in this example, writes directed to the LUNs 110a, 110b may be received for processing by either of the nodes 102a and 102b, the example 100 illustrates what may also be referred to as an active-active configuration.

In connection with a write operation as may be received from a host and processed by the processing node A 102a, the write data may be written to the system cache 104b, marked as write pending (WP) denoting it needs to be written to the physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned to the host (e.g., by component the 104a). At various points in time, the WP data stored in the system cache is flushed or written out to the physical storage 110a, 110b.

In connection with the inline processing layer 105a, prior to storing the original data on the physical storage 110a, 110b, one or more data reduction operations may be performed. For example, the inline processing may include performing data compression processing, data deduplication processing, and the like, that may convert the original data (as stored in the system cache prior to inline processing) to a resulting representation or form which is then written to the physical storage 110a, 110b.

In connection with a read operation to read a block of data, a determination is made as to whether the requested read data block is stored in its original form (in system cache 104b or on physical storage 110a, 110b), or whether the requested read data block is stored in a different modified form or representation. If the requested read data block (which is stored in its original form) is in the system cache, the read data block is retrieved from the system cache 104b and returned to the host. Otherwise, if the requested read data block is not in the system cache 104b but is stored on the physical storage 110a, 110b in its original form, the requested data block is read by the BE component 104c from the backend storage 110a, 110b, stored in the system cache and then returned to the host.

If the requested read data block is not stored in its original form, the original form of the read data block is recreated and stored in the system cache in its original form so that it can be returned to the host. Thus, requested read data stored on physical storage 110a, 110b may be stored in a modified form where processing is performed by 105a to restore or convert the modified form of the data to its original data form prior to returning the requested read data to the host.

Also illustrated in FIG. 2B is an internal network interconnect 120 between the nodes 102a, 102b. In at least one embodiment, the interconnect 120 may be used for internode communication between the nodes 102a, 102b.

In connection with at least one embodiment in accordance with the techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. The processor cache may be substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage. For example, in at least one embodiment, a RAM based memory may be one of the caching layers used as to cache the write data that is then flushed to the backend physical storage.

When the processor performs processing, such as in connection with the inline processing 105a, 105b as noted above, data may be loaded from the main memory and/or other lower cache levels into its CPU cache. In particular, inline data deduplication (ILD) and inline compression (ILC) may be performed as part of the inline processing 105a, 105b. An embodiment may perform deduplication processing inline as part of the data path or I/O path. More generally, deduplication may be performed at any suitable time supported in an embodiment. For example, in at least one embodiment, deduplication processing may also be performed offline not as part of the data path or I/O path on data stored on BE PDs. An embodiment may perform compression processing inline as part of the data path or I/O path. More generally, compression processing may be performed at any suitable time supported in an embodiment. For example, in at least one embodiment, compression processing may also be performed offline not as part of the data path or I/O path on data stored on BE PDs.

Some existing implementations of deduplication use a deduplication data store (dedupe data store or DB) as described in connection with the element 230 of the FIG. 2A having a hash table organized by indices which are randomly distributed and approximate a uniform distribution.

Data deduplication may be performed at the data block level of granularity, for example, where each entry of the data store 230 is mapped to a single unique data block. As sometimes used herein, a target data block, target block or dedupe target refers to a single unique instance of a data block currently stored in the dedupe data store 230. Also sometimes used herein, reference is made to a candidate data block, candidate block or dedupe candidate that refers to a data block for which deduplication processing is performed with the goal of eliminating duplicate candidate blocks from being stored. A hash may be computed for the candidate data block using a hash function whereby the hash identifies the candidate data block with a high level of uniqueness, even though the hash is typically much smaller than the candidate data block itself. Hashes thus enable data block matching between the candidate and target data blocks in the dedupe data store 230 to proceed quickly and efficiently. Consistent with discussion above, for each hash in an entry of the dedupe data store 230, the data store 230 may store a pointer that leads to a stored version of the respective target data block. To perform deduplication on a particular candidate block, a storage system computes a hash of the candidate block and searches the dedupe data store 230, or a cached version thereof, for an entry that matches the computed hash. If a match is found, the storage system may then compare the actual content of the target block with the content of the candidate block to ensure the target and candidate data blocks having matching content. If the target and candidate data blocks having matching content, processing may arrange metadata of the candidate block to point to the target data block that the dedupe data store 230 has associated with the matching hash. In this manner, a duplicate copy of the data block is avoided.

In at least one embodiment, the data storage system may be configured to include one or more pairs of nodes, where each pair of nodes may be generally as described and represented as the nodes 102a-b in the FIG. 2B. For example, a data storage system may be configured to include at least one pair of nodes and at most a maximum number of node pairs, such as for example, a maximum of 4 node pairs. The maximum number of node pairs may vary with embodiment. In at least one embodiment, a base enclosure may include the minimum single pair of nodes and up to a specified maximum number of PDs. In some embodiments, a single base enclosure may be scaled up to have additional BE non-volatile storage using one or more expansion enclosures, where each expansion enclosure may include a number of additional PDs. Further, in some embodiments, multiple base enclosures may be grouped together in a load-balancing cluster to provide up to the maximum number of node pairs. Consistent with other discussion herein, each node may include one or more processors and memory. In at least one embodiment, each node may include two multi-core processors with each processor of the node having a core count of between 8 and 28 cores. In at least one embodiment, the PDs may all be non-volatile SSDs, such as flash-based storage devices and storage class memory (SCM) devices. It should be noted that the two nodes configured as a pair may also sometimes be referred to as peer nodes. For example, the node A 102a is the peer node of the node B 102b, and the node B 102b is the peer node of the node A 102a.

In at least one embodiment, the data storage system may be configured to provide both block and file storage services with a system software stack that includes an operating system running directly on the processors of the nodes of the system.

In at least one embodiment, the data storage system may be configured to provide block-only storage services (e.g., no file storage services). A hypervisor may be installed on each of the nodes to provide a virtualized environment of virtual machines (VMs). The system software stack may execute in the virtualized environment deployed on the hypervisor. The system software stack (sometimes referred to as the software stack or stack) may include an operating system running in the context of a VM of the virtualized environment. Additional software components may be included in the system software stack and may also execute in the context of a VM of the virtualized environment.

In at least one embodiment, each pair of nodes may be configured in an active-active configuration as described elsewhere herein, such as in connection with FIG. 2B, where each node of the pair has access to the same PDs providing BE storage for high availability. With the active-active configuration of each pair of nodes, both nodes of the pair process I/O operations or commands and also transfer data to and from the BE PDs attached to the pair. In at least one embodiment, BE PDs attached to one pair of nodes may not be shared with other pairs of nodes. A host may access data stored on a BE PD through the node pair associated with or attached to the PD.

In at least one embodiment, each pair of nodes provides a dual node architecture where both nodes of the pair may be identical in terms of hardware and software for redundancy and high availability. Consistent with other discussion herein, each node of a pair may perform processing of the different components (e.g., FA, DA, and the like) in the data path or I/O path as well as the control or management path.

Processing may be performed to assess the performance and data reduction efficiency of different data reduction techniques used in data storage systems, or more generally, used in any suitable system performing data reduction techniques. For example, processing may be performed to assess the performance and data reduction efficiency for different compression and/or deduplication algorithms. In particular, different compression and/or deduplication algorithms may be run on sets of test data to validate or verify the expected performance and data reduction efficiency benchmarks of such algorithms. In order to perform this assessment, existing software tools may be used to generate the test data used to measure and validate the expected performance and data reduction efficiency of compression and data deduplication algorithms. Existing tools typically use a simplistic algorithm to generate the test data according to specified configurable compression and deduplication ratios. For example, a user may specify a compression ratio (CR) such as 4:1, denoting that the compressed form of the generated test data is expected to be approximately (e.g., within specified tolerances or bounds) ¼ the size of the original or uncompressed form of the test data. As another example, a user may specify a data deduplication rate (DR) such as 5:1, denoting that the deduplicated form of the generated test data is expected to be approximately (e.g., within specified tolerances or bounds) ⅕ the size of the original test data. It should be noted that generally quantities or amounts such as related to specified values for configured CRs, DRs and other measurements may be approximate in that the actual results achieved as a result of data reduction processing may be within specified tolerances or bounds of the specified values.

Existing techniques using simplistic algorithms in test data generation may result in sometimes non-trivial differences between the expected configured data reduction efficiency (e.g., the configured compression and deduplication ratios) and the actual data reduction achieved when the test data is compressed and/or deduplicated. The differences may be, for example, greater than specified tolerances or bounds of allowable, acceptable differences.

To further illustrate, at least one existing technique for generating test data includes filling a generated buffer of test data with 1/CR of randomly generated data and the remainder of the buffer with zeroes. For example, a user may specify a compression ratio (CR) of 4:1, where the existing technique generates a buffer including ¼ randomly generated data and with the remaining ¾ of the buffer filled with zeroes. A large page, such as 1 MB (megabyte), of test data may be generated with the mix of random and zero filled regions that are expected to compress at the specified desired CR of 4:1. Smaller chunks, such as 4K bytes, may be obtained as needed from the generated large page, such as by randomly reading from different offsets in the large page or by reading the smaller chunks at incremented offsets within the large page. A pseudo-random number generator technique may be used to generate the content or fill for regions containing random data. The underlying rationale of the existing technique is that the randomly generated data is expected to be unique and thus uncompressible while the zero filled regions are highly compressible.

Using the existing techniques, there is generally a deviation between the actual data reduction ratio of the test data and the expected data reduction ratio (e.g., specified as an input to the tool when generating the test data). Generally, the deviation typically increases as the specified CR and DR also increase. One problem with the existing techniques is that the different generated random portions may not be sufficiently random or unique especially when generating large amounts of test data. For successively generated buffers including random portions, there may be duplicates among the random portions such as due to the methods and inputs used to generate the random portions. For example, the particular algorithm, such as the pseudo random number generator used to generate the random portions, may be computationally expensive but may not generate sufficiently random or unique data included in the random portions. In this case, the random portions of generated test data sets may contain unexpected duplicates thereby violating the assumption that the random portions of test data are unique and not duplicates and causing a deviation between the expected data reduction ratio and the actual data reduction ratio achieved.

Additionally, the existing techniques used to generate the test data may not take into consideration the actual different compression algorithms and associated settings used to compress the test data, where the particular algorithms used and the associated settings may substantially alter the achieved actual data reduction as compared to the configured or predicted data reduction settings.

Based on the above, there may be unexpected deviations introduced between the achieved actual data reduction of test data as compared to the configured or predicted data reduction settings. Introducing such unexpected deviations adds to inaccuracies in functional and regression testing of code, such as code of the data reduction system and facilities and generally code of the data storage system. For example, observed non-trivial deviations or differences between the achieved actual data reduction of test data as compared to the configured or predicted data reduction settings cannot be readily attributed to problems with code changes or algorithm implementations since such deviations or differences may also be due to other causes in connection with test data generation.

Described in the following paragraphs are techniques that may be used to generate data that, as a result of data reduction processing, accurately achieves preconfigured or specified data reduction benchmarks, such as for a specified CR and a specified DR. The techniques provide for generating data that, when subjected to data reduction processing, does not result in unexpected deviations between the achieved actual data reduction of the data as compared to the configured or predicted data reduction settings. The data reduction processing may include compression processing. The data reduction processing may include deduplication processing. The techniques described in the following paragraphs take into account data reduction differences that may be due to the particular data reduction algorithm utilized, such as the particular compression algorithm used.

In at least one embodiment, a set of one or more initial buffers may be determined. The set of initial buffers may be customized for the specific compression algorithm used and for a particular specified CR to be achieved using the specific compression algorithm. The initial set of buffers may be generated in any suitable manner. In at least one embodiment, an initial buffer included in the set may be determined by trial and error, and examining the achieved compressibility of randomly generated content for candidate buffers. For example, the specific compression algorithm may be used to compress various candidate buffers and observe the resulting CR achieved for such candidate buffers. The particular one or more candidate buffers that achieve the specified CR when compressed with the specific compression algorithm may be included in the set of initial buffers. A different set of one or more initial buffers may be determined for each different combination of compression algorithm and CR value. For example, a data storage system may support use of multiple lossless compression algorithms known in the art such as, for example, DEFLATE, bzip2, and generally any suitable compression algorithm. As known in the art, the bzip2 compression algorithm is based on a combination of the Burrows-Wheeler transform, RLE (run length encoding) and Huffman coding techniques; and the DEFLATE compression algorithm combines LZSS (Lempel-Ziv-Storer-Szymanski) compression with Huffman coding. For the DEFLATE compression algorithm, two different CR values such as 4:1 and 5:1 may be specified. In accordance with the techniques herein, 2 different sets of initial buffers may be determined for the DEFLATE compression algorithm—one set of initial buffers which when compressed by the DEFLATE compression algorithm achieve a CR=4:1, and a second set of initial buffers which when compressed by the DEFLATE compression algorithm achieve a CR=4:1. For the bzip2 compression algorithm, two different CR values such as 2:1 and 5:1 may be specified. In accordance with the techniques herein, 2 different sets of initial buffers may be determined for the bzip2 compression algorithm—one set of initial buffers which when compressed by the bzip2 compression algorithm achieve a CR=2:1, and a second set of initial buffers which when compressed by the bzip2 compression algorithm achieve a CR=5:1.

Using an initial buffer determined for an associated combination of a specified compression algorithm and a specified CR, a first set of one or more other buffers may be generated. The first set of one or more other buffers are expected to achieve the specified CR when compressed using the specified compression algorithm. In this manner, the initial buffer may be used to generate, construct or derive the first set of one or more other buffers. A counter may be initialized to zero and associated with the initial buffer. The initial buffer may be partitioned into a first portion and a second portion. The first portion of the initial buffer may include first content stored at a first location, such as at specific byte or bit positions, in the initial buffer. The second portion of the initial buffer may include second content stored at a second location, such as specific byte or bit positions, in the initial buffer. In at least one embodiment, a buffer of the first set may be initialized to include a uniqueness stamp (UST) stored at the first location in the buffer. The buffer of the first set may also include the second content from the initial buffer stored at the second location in the buffer. The UST may be the current value of the counter associated with the initial buffer. After the current value of the counter is used as the UST value for the buffer included in the first set, the counter may be incremented by one. The updated counter value may be used as the UST value stored at the first location in the next initialized or generated buffer of the first set. In this manner, each buffer of the first set includes a different or unique UST value at the first location in the buffer, and also includes the same second content from the initial buffer at the second location in the buffer.

In at least one embodiment, the first location of the initial buffer and buffers of the first set may correspond to an 8 byte or 64 bit non-negative value. The first location may correspond to a region at one end of each buffer. Each buffer in the first set as well as the initial buffer may be the same size, such as a 4K bytes. Generally, the size of each buffer may be any suitable size, such as a size within the inclusive range from 4K bytes through 128K bytes.

The initial buffer having the associated counter may be used as described above to generate a first set of one or more buffers for use with the specified compression algorithm and specified CR. Subsequently, the initial buffer and the maximum or largest value attained by the associated counter (while generating the first set of buffers) may also be used to generate a second set of one or more duplicate buffers for use with the same specified compression algorithm and specified CR. Each buffer in the second set may be the same size as the initial buffer and each buffer in the first set. In at least one embodiment, a buffer of the second set may be initialized to store a selected one of the prior counter values of the associated counter at the first location in the buffer. Put another way, the content stored at the first location in the buffer of the second set is one of the UST values stored in one buffer from the first set. The buffer of the second set may also include the second content from the initial buffer stored at the second location in the buffer. In at least one embodiment, the prior counter value or prior UST value stored in the first location of the buffer may be randomly selected as a value in the inclusive range 0 through MAX UST, where MAX UST denotes the highest or maximum value attained by the counter associated with the initial buffer. In this manner, each buffer of the second set may be a randomly selected duplicate of a buffer from the first set.

A total amount of desired buffers may be generated and included in a data set, where the data set includes the first set of buffers and the second set of buffers. To achieve a desired percentage of duplicate buffers in the data set, processing may be performed to generate a desired first amount of buffers in the first set and a desired second amount of duplicate buffers in the second set. The desired percentage of duplicate buffers in the data set may be based on a target DR specified. For example, if the DR is 2:1, the desired percentage of duplicate buffers in the data set is 50%. Based on this, the first set of buffers and the second set of duplicate buffers may both include the same number of buffers.

In at least one embodiment, using the techniques described herein for generating the first set of buffers guarantees that each generated buffer of the first set includes a unique UST. Thus each buffer of the first set is unique or not a duplicate with respect to all other buffers of the first set. Additionally, using the techniques described herein for generating the second set of buffers guarantees that each generated buffer of the second set is a duplicate of a buffer of the first set.

Using the techniques herein, an overall or total data reduction rate (DRR) expected for the generated data set is a mathematical product of the specified DR*the specified CR. For example, if the DR is 2:1 and the CR is 5:1, then the total DRR expected for the data set generated using the techniques herein is 10:1. The foregoing total DRR of 10:1 is what is expected when the generated data set is deduplicated and compressed using the specified compression algorithm.

It should be noted that an embodiment in accordance with the techniques herein may use a hash function in connection with data deduplication, where the hash function is characterized as a high quality hash function. The hash function may be considered high quality in that the hash function has an acceptably low probability of a hash collision rate as described elsewhere herein. Thus, the hash function approximately uniformly distributes the input data across the entire set of possible hash values. Additionally, the hash function may generally generate very different hash values for similar strings. Data deduplication processing may be generally as described herein and known in the art. In at least one embodiment, data deduplication processing may use a cryptographic hash function in connection with hashing data buffers or chunks to determine hash values when detecting duplicate data buffers or chunks. As a variation, an embodiment may use a hash function that may be characterized as a non-cryptographic hash function that is less computationally expensive and weaker relative to other cryptographic hash functions. In this case the non-cryptographic hash function may have a higher hash collision probability than a cryptographic hash function. However, the non-cryptographic hash function used with data deduplication has an acceptably and sufficiently low probability of a hash collision.

The foregoing and other aspects of the techniques herein are described in more detail in the following paragraphs.

Consistent with discussion elsewhere herein, processing may be performed to generate one or more sets of initial buffers. Each set of initial buffers may generally include at least one initial buffer. A set of initial buffers may determined for each unique combination of compression algorithm and specified CR.

Figure 3:
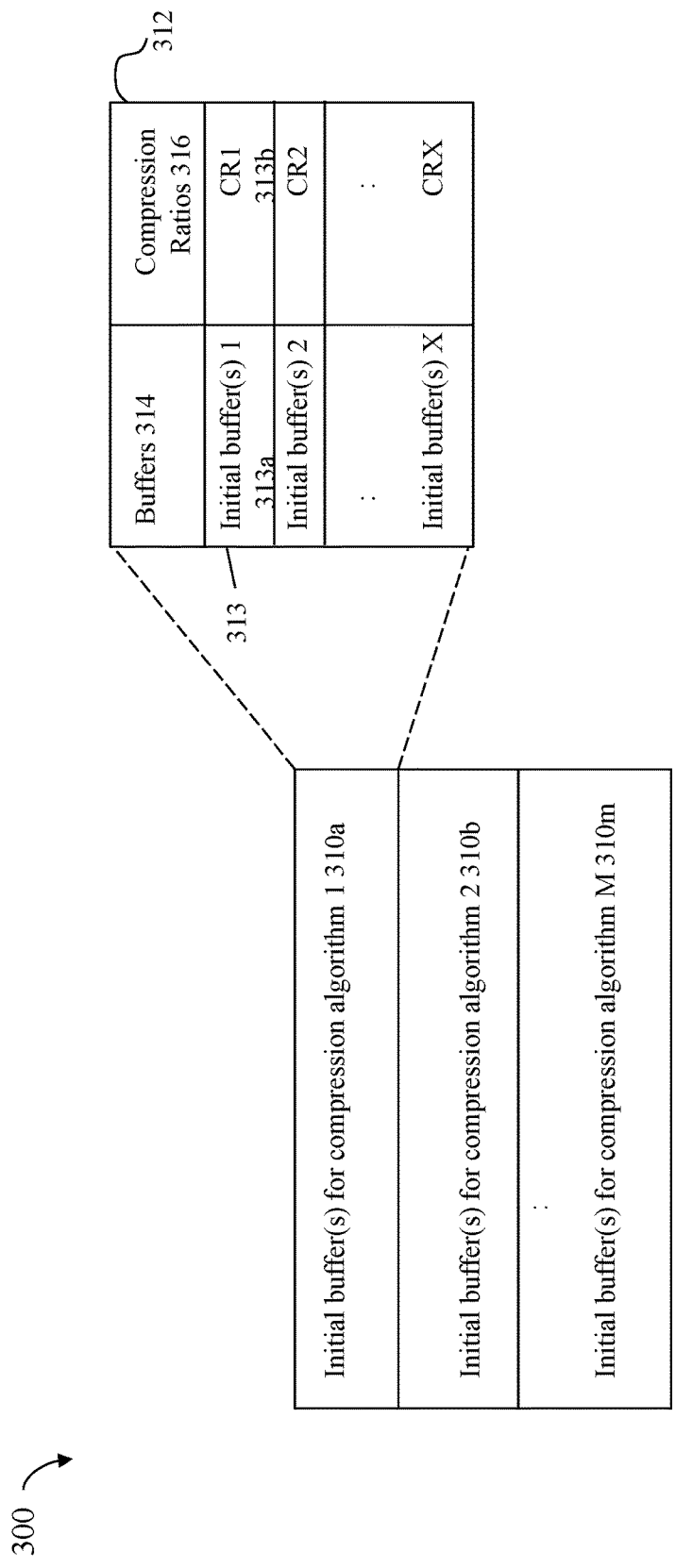
FIG. 3 is a representation of a table including sets of initial buffers for a compression algorithm, where each set of initial buffers compresses to a different associated compression ratio using the compression algorithm, that may be used in an embodiment in accordance with the techniques herein.

Referring to FIG. 3, shown is a representation of sets of initial buffers that may be used in an embodiment in accordance with the techniques herein. The example 300 presents the sets of initial buffers in a table form for purposes of illustration. Generally, the initial buffers may be included in any suitable organization or structure. The example 300 illustrates sets of initial buffers having content prepared for use with M different compression algorithms. Generally M may be any suitable number and an integer value that is greater than zero. M may denote, for example, the number of supported compression algorithms that may be selected for use in an embodiment of a data storage system in connection with performing compression processing of data. The example 300 includes a first portion 310a denoting sets of initial buffers prepared for use with a first compression algorithm 1, includes a second portion 310b denoting sets of initial buffers prepared for use with a second compression algorithm 2, and includes an $M^{th}$ portion 310m denoting sets of initial buffers prepared for use with an $M^{th}$ compression algorithm.

The element 312 provides more detail regarding the sets of initial buffers for each of the different M compression algorithms. Although element 312 is illustrated as providing more detail regarding the portion 310a for the compression algorithm 1, each of the remaining portions 310b-m may similarly include information as illustrated by 312.

The element 312 includes a first column of buffers 314 and a second column of compression ratios 316. The element 312 denotes a table with a row identifying the one or more initial buffers (314) determined for each of the different CRs (316) for the compression algorithm 1. For example, assume that for the first compression algorithm 1, it is desired to determine sets of initial buffers for 2 different target CRs—2:1 and 4:1. In this case, the table 312 includes a first row with a first initial buffer set for the target CR 2:1 and includes a second row with a second initial buffer set for the target CR 4:1. Each initial buffer set may include at least one initial buffer for the unique combination of the compression algorithm and the desired target CR. It should be noted that if an option of no compression is desired, a target CR=1:1 may be specified.

In connection with the techniques herein, processing may be performed to evaluate candidate buffers as potential initial buffers for different compression algorithms and different CRs. The processing may generally, compress a candidate buffer using a specified one of the M compression algorithms to generate a compressed form of the candidate buffer. The CR achieved as a result of the compression of the candidate buffer may be determined. If the CR achieved matches (e.g., within specified bounds or tolerances) one of the desired target CRs for the specified compression algorithm, then the candidate buffer may be included in the set of initial buffers associated with the specified compression algorithm and matching target CR. For example, a candidate buffer may be compressed using the first compression algorithm 1 and achieve a CR of 2:1. In this case, the candidate buffer may be included in a set of initial buffers known to achieve a 2:1 CR when compressed with the first compression algorithm 1. With reference to the table 312 including initial buffers calibrated from the first compression algorithm 1, the row 313 may include the initial buffers 313a for the CR1=2:1 313b, where the candidate buffer may be included in the set 313a. If the candidate buffer did not achieve a CR matching one of the desired target CRs for the first compression algorithm 1, then the candidate buffer may be discarded, or otherwise further evaluated as a candidate initial buffer for another compression algorithm. The foregoing processing may be repeated for any desired number of candidate buffers for any desired number of compression algorithms and different CRs.

It should be noted that if an option of no compression is desired for a particular compression algorithm, a target CR=1:1 may be specified. In this case, candidate buffers are selected as initial buffers which result in no compression when the candidate buffers are compressed using the particular compression algorithm.

Any suitable technique may be used to generate or obtain the multiple candidate buffers. In at least one embodiment, the multiple candidate buffers may be obtained using content from an existing data set. As a variation, an embodiment may generate the candidate buffers to include randomly generated data.

In this manner, the table 300 may be populated with sets of initial buffers known to precisely result in the desired CRs for each of the M specified compression algorithms used in the data storage system.

The sets of initial buffers may be determined in a first step. At a minimum, in the first step an embodiment may determine a single initial buffer for a single compression algorithm and single target CR.

Subsequent to determining the sets of initial buffers, processing may be performed to generate a data set of buffers for use with a particular one of the M compression algorithms and according to a configurable CR and a configurable DR. The generated data set is expected to achieve a total DRR=CR*DR. For example, if CR=5:1 and DR=2:1, then the expected DRR is 10:1 when the data set is compressed using the particular one compression algorithm. In connection with the techniques herein, processing may be performed to generate the data set using an initial buffer associated with the particular compression algorithm and associated with the specified configurable CR.

In connection with generating the data set, processing may be performed to generate a first set of buffers. Each buffer in the first set is unique or not a duplicate buffer with respect to all other buffers in the first set. In connection with determining the first set of buffers, a counter associated with the initial buffer may be used. In at least one embodiment, a different value of the counter may be used in connection with each generated buffer of the first set of buffers. The counter may be initialized to zero and used in connection with generating content for a first buffer of the first set. Subsequently, a revised value for the counter may be determined by incrementing the current counter value by 1. The revised value of the counter may be used in connection with generating content for the next second buffer of the first set. Subsequently, a revised value for the counter may be determined by again incrementing the current counter value by 1. The foregoing may be repeated in connection with each additional buffer generated for the first set such that each buffer of the first set includes content based on a different counter value. As described herein, the counter may be incremented by 1 each time a new buffer of the first set is generated in order to provide unique content for each buffer of the first set.

In at least one embodiment, the current counter value may be represented as a 64 bit integer value or UST stored at the beginning of each generated buffer of the first set. Other than the UST in each buffer of the first set, the remainder of each buffer of the first set may match content of the initial buffer. The process of generating the first set of buffers is described in more detail below with reference to FIG. 4.

Figure 4:
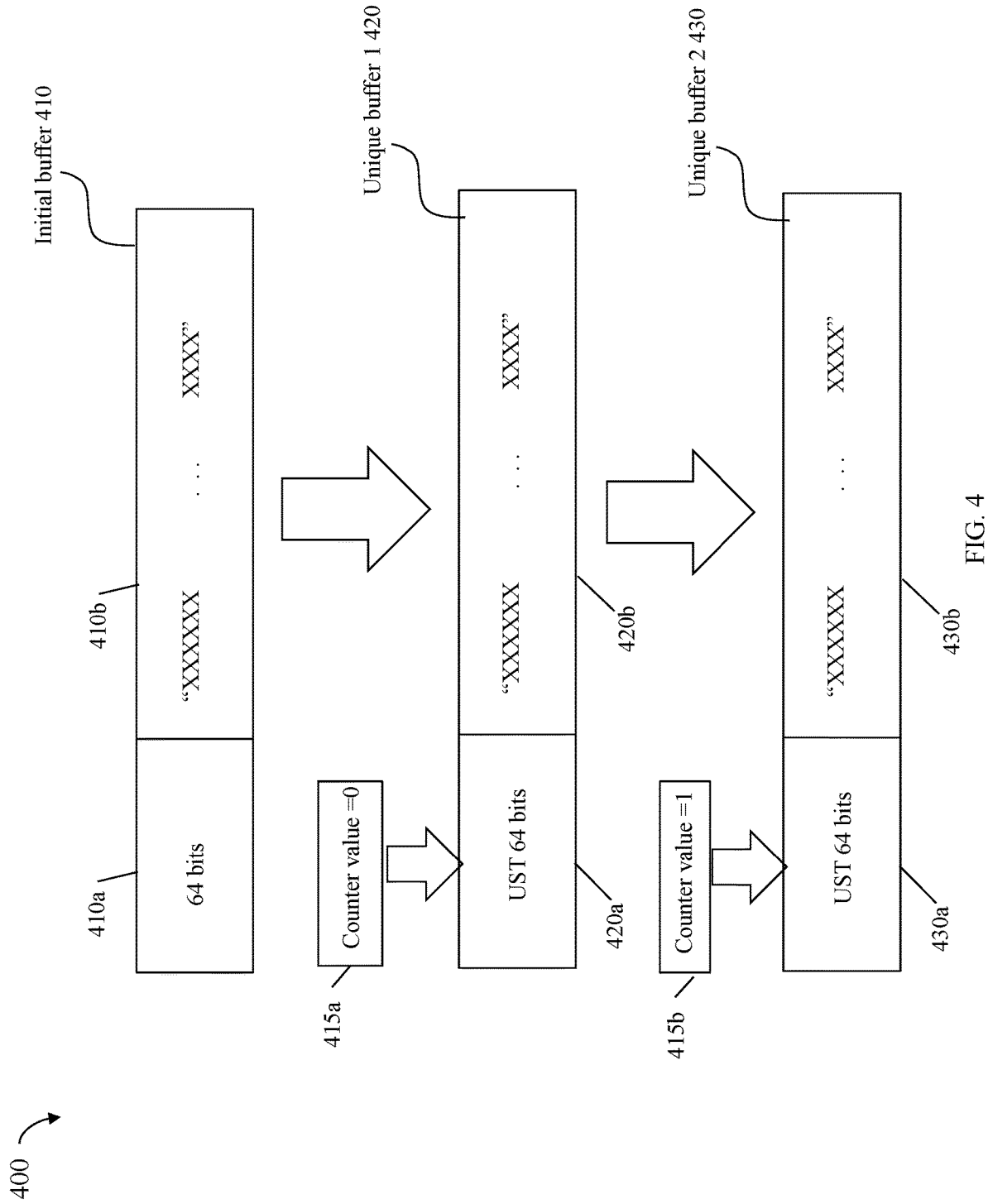
FIGS. 4 and 5 are examples illustrating generation of buffers of the data set in an embodiment in accordance with the techniques herein.

Referring to FIG. 4, shown is an example 400 illustrating generating buffers of the first set from an initial buffer in an embodiment in accordance with the techniques herein. Consistent with other discussion herein, the initial buffer is associated with a specified compression algorithm and a specified CR denoting that the initial buffer, when compressed with the specified compression algorithm, achieves the specified CR.

Using the initial buffer 410 determined for an associated combination of a specified compression algorithm and a specified CR, a first set of one or more other buffers 420, 430 may be generated. The first set of one or more other buffers 420, 430 are expected to achieve the specified CR when compressed using the specified compression algorithm. In this manner, the initial buffer 410 may be used to generate, construct or derive the first set of one or more other buffers 420, 430. The counter 415a may be initialized to zero and associated with the initial buffer 410.

The initial buffer 410 may be partitioned into a first portion 410a and a second portion 410b. The first portion 410a of the initial buffer 410 may include first content stored at a first location, such as at specific byte or bit positions, in the initial buffer. The second portion 410b of the initial buffer may include second content stored at a second location, such as specific byte or bit positions, in the initial buffer 410.

In at least one embodiment, the first location 410a of the initial buffer 410 may correspond to an 8 byte or 64 bit non-negative value. The first location 410a may correspond to a region at one end of the initial buffer 410, such as at the beginning of the initial buffer 410. Each buffer in the first set as well as the initial buffer 410 may be the same size, such as a 4K bytes. Generally, the size of each buffer may be any suitable size, such as a size within the inclusive range from 4K bytes through 128K bytes. The second portion 410b of the initial buffer 410 may include content denoted as a string of Xs, i.e., "XXXXXX . . . XXXX", in FIG. 4.

In at least one embodiment, a first unique buffer 420 of the first set may be initialized to include a UST stored at the first location 420a in the buffer. The buffer 420 of the first set may also include the second content stored at the second portion 410b of the initial buffer 410. In particular, the UST stored in 420a may be the current value of the counter 415a associated with the initial buffer. The second content stored in the second portion 410b of the initial buffer 410b may be copied to the second portion 420b of the buffer 420.

After the current value of 0 for the counter 415a is used as the UST value for the buffer 420 included in the first set, the counter may be incremented by one. The updated counter value of 1, denoted as 415b, may be used as the next UST value stored at the first location 430a in the next generated buffer 430 of the first set. Additionally, the second content stored in the second portion 410b of the initial buffer 410 may be coped to the second portion 430b of the next generated buffer 430. In this manner, the second generated buffer 430 of the first set includes a different or unique UST value at the first location 430a in the buffer 430, and also includes the same second content from the second portion 410b of the initial buffer 410.

Generally, the UST values used in generating the buffers 420, 430 of the first set correspond to the monotonically incremented counter values 415a-b for the counter associated with the initial buffer 410.

In a similar manner, one or more additional buffers of the first set may be generated. Each additional buffer of the first set may include a 64 bit UST based on the next incremental counter value, where the UST may be located in the beginning of the additional buffer. The remaining content of the additional buffer matches corresponding content of the second portion of the original buffer 410. In at least one embodiment, each new buffer of the first set may be constructed by first copying the content of the original buffer to the new buffer, and then overwriting the beginning 64 bits of the new buffer with the current counter value corresponding to the UST for the new buffer. In this case, each buffer of the first set has unique content with respect to other buffers of the first set. In other words, the first set does not include any duplicate buffers. Each buffer of the first set is unique with respect to other buffers of the first set based on the different UST values stored as content in the buffers of the first set. Thus, each buffer 420, 430 of the first set includes the same content as the initial buffer 410 but for the single unique UST at the beginning of each buffer 420, 430 of the first set. Since each buffer 420, 430 of the first set only varies in terms of content from the initial buffer 410 by the different UST value at the beginning of each buffer 420, 430, each buffer 420, 430 is expected to substantially achieve the same expected CR associated with the initial buffer. In other words, the unique buffers 420, 430 of the first set generated using the techniques herein generally preserve and maintain the CR of the initial buffer 410. Each unique buffer 420, 430 of the first set generated in accordance with the techniques herein compresses to approximately (e.g., within a specified tolerance or threshold) the same CR as the initial buffer 410, when such compression is performed using the particular compression algorithm used to initially calibrate and determine the CR for the initial buffer 410.

As each additional buffer of the first set is generated, the counter value reflects the highest or maximum UST value used in connection with generating the first set of buffers.

It should be noted that the elements 410a, 420a and 430a denote the same corresponding bit positions, respectively, in the buffers 410, 420 and 430; and that the elements 410b, 420b and 430b denote the same corresponding bit positions, respectively, in the buffers 410, 420 and 430.

The initial buffer having the associated counter may be used as described above in connection with FIG. 4 to generate a first set of one or more buffers for use with the specified compression algorithm and specified CR. Subsequently, the initial buffer and the maximum or largest value attained by the associated counter (while generating the first set of buffers) may also be used to generate a second set of one or more duplicate buffers for use with the same specified compression algorithm and specified CR. Each buffer in the second set may be the same size as the initial buffer and each buffer in the first set. In at least one embodiment, a buffer of the second set may be initialized to store a selected one of the prior counter values of the associated counter at the first location in the buffer. Put another way, the content stored at the first location in the buffer of the second set is one of the UST values stored in one buffer from the first set. The buffer of the second set may also include the second content from the initial buffer stored at the second location in the buffer. In at least one embodiment, the prior counter value or prior UST value stored in the first location of the buffer may be randomly selected as a value in the inclusive range 0 through MAX UST, where MAX UST denotes the highest or maximum value attained by the counter associated with the initial buffer. In this manner, each buffer of the second set may be a randomly selected duplicate of a buffer from the first set. The foregoing processing performed to generate the second set of duplicate buffers is described in more detail below with reference to the FIG. 5.

Figure 5:
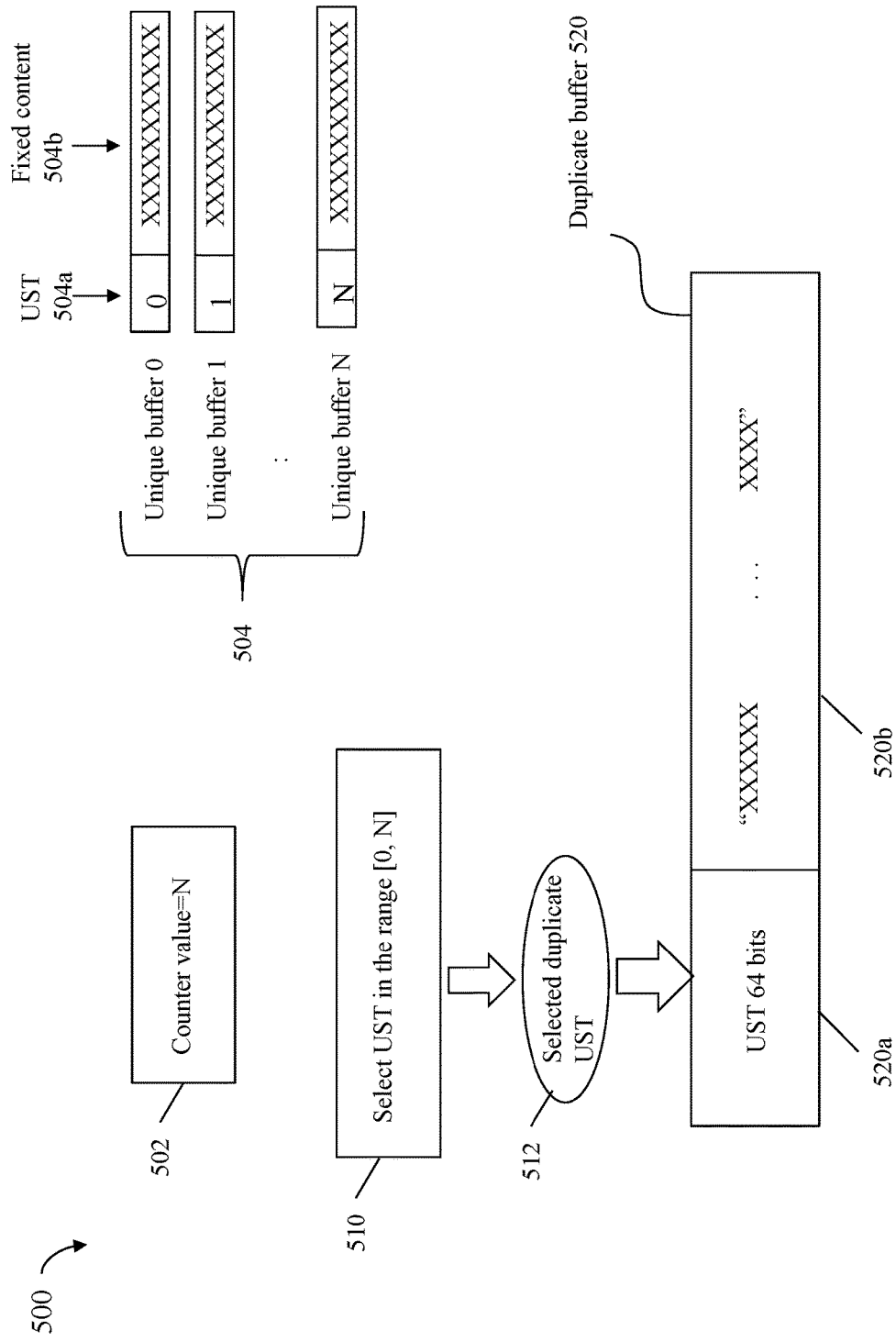

Referring to FIG. 5, shown is an example 500 illustrating use of the techniques herein in connection with generating the second set of duplicate buffers in an embodiment in accordance with the techniques herein.

The example 500 includes the element 504 denoting the first set of unique buffers generated as described above in connection with FIG. 4. The example 500 includes the element 502 denoting the counter value of N, where N is MAX UST, since N is the largest or maximum value attained by the counter when generating the first set buffers 504.

The example 500 includes the element 510 denoting processing performed to select one of the USTs in the inclusive range from 0 through N. The element 512 denotes the UST selected from the range by the processing 510, where the selected UST is stored at the first position 520a in the buffer 520 of the second set. The element 520b denotes the second portion and the second position within the buffer 520. The second portion 520b includes the original second content from the second portion 410b of the initial buffer 410 of FIG. 4. In at least one embodiment, the duplicate buffer 520 may be constructed by first copying the content from the initial buffer 410 to the buffer 520. Subsequently, processing may be performed to store the selected duplicate UST 512 in the first portion and first location 520a of the buffer 520.

It should be noted that the element 410a of FIG. 4 and the element 520a of FIG. 5 denote the same corresponding bit positions, respectively, in the buffer 410 of FIG. 4 and the buffer 520 of FIG. 5. Additionally, the element 410b of FIG. 4 and the element 520b of FIG. 5 denotes the same corresponding bit positions, respectively, in the buffer 410 of FIG. 4 and the buffer 520 of FIG. 5.

In at least one embodiment, the processing 510 performed to select the UST in the range [0,N] may generate a pseudo-random UST in the foregoing range.

The foregoing as described above and illustrated in the FIG. 5 may be performed in connection with generating each duplicate buffer of the second set.

A total amount of desired buffers may be generated and included in the data set, where the data set includes the first set of buffers and the second set of buffers. To achieve a desired percentage of duplicate buffers in the data set, processing may be performed to generate a desired first amount of buffers in the first set and a desired second amount of duplicate buffers in the second set. The desired percentage of duplicate buffers in the data set may be based on a target DR specified. For example, if the DR is 2:1, the desired percentage of duplicate buffers in the data set is 50%. Based on this, the first set of buffers and the second set of duplicate buffers may both include the same number of buffers.

In at least one embodiment, using the techniques described herein for generating the first set of buffers guarantees that each generated buffer of the first set includes a unique UST. Thus each buffer of the first set is unique or not a duplicate with respect to all other buffers of the first set. Additionally, using the techniques described herein for generating the second set of buffers guarantees that each generated buffer of the second set is a duplicate of a buffer of the first set.

Using the techniques herein, an overall or total data reduction rate (DRR) expected for the generated data set is a mathematical product of the specified DR*the specified CR. For example, if the DR is 2:1 and the CR is 5:1, then the total DRR expected for the data set generated using the techniques herein is 10:1. The foregoing total DRR of 10:1 is what is expected when the generated data set is deduplicated and compressed using the specified compression algorithm.

When generating the total number of desired buffers of the data set, an embodiment may alternate between generating some buffers of the first set and generating some buffers of the second set. For example, assume that the data set needs to includes 100 buffers with the first set including 50 buffers and the second set including 50 buffers. In at least one embodiment, processing may be performed to first generate all 50 buffers of the first set and then subsequently generate all 50 buffers of the second set. As a variation, an embodiment may perform more than one cycle of alternating between generating buffers of the first set and the second set. For example, as a variation, an embodiment may perform processing in the following sequence: generate buffers 1-10 of the first set, generate buffers 1-10 of the second set, generate buffers 11-20 of the first set, generate buffers 11-20 of the second set, generate buffers 21-30 of the first set, generate buffers 21-30 of the second set, generate buffers 31-40 of the first set, generate buffers 31-40 of the second set, generate buffers 41-50 of the first set, and generate buffers 41-50 of the second set. The foregoing are some examples illustrating the particular sequence in which processing may be performed to generate all the desired buffers of the first and second sets comprising the total or complete data set of 100 buffers. More generally, any suitable number of cycles may be performed that alternate between generating buffers of the first set and the second set until the desired number of buffers in each set is reached.

Although the techniques herein are illustrated in above examples using only a single initial buffers to generate a desired data set, an embodiment may generally use one or more initial buffers to generate the desired data set. In such an embodiment, processing as described herein may be performed with respect to each initial buffer used. For example, if multiple initial buffers are used to generate the data set, a different counter may be associated with each initial buffer. The multiple initial buffers are included in the same set of initial buffers for the specified compression algorithm and specified CR. In other words, each of the initial buffers may be known to achieve the specified CR when compressed using the specified compression algorithm. In one aspect, such initial buffers may be characterized as calibrated for use with the specified compression algorithm and specified CR.

The data set generated using the techniques herein may be used for any suitable purposes. Consistent with other discussion herein, the data set generated in accordance with the techniques herein for a specified compression algorithm, specified DR and specified CR may be used to validate or verify the specified compression algorithm. In particular, compression of the data set (or portions thereof) using the specified compression algorithm is expected to achieve a total DRR=DR*CR. The data set may be compressed and the actual total DRR determined and compared to the expected DRR. If there is no difference between the actual total DRR and the expected total DRR (e.g., a difference within specified tolerances or limits), then the validation or verification of the specified compression algorithm is successful. Otherwise, it may be determined that verification or validation of the specified compression algorithm has failed. The verification or validation failure may indicate that there is an error or other problem with the underlying code used in connection with compressing the data set. For example, the error may be in code of the compression algorithm, code of the deduplication processing, code used in connection with performing data reduction processing, and the like.

Generally, a difference or deviation between the actual total DRR and the expected total DRR whereby the validation or verification fails denotes a unit testing failure or regression test failure of underlying code used in connection with compressing the data set.

Verifying and validating that the data reduction techniques achieve expected benchmark levels may also be important for customer expectations. For example, a data storage vendor may publish documentation indicating that a particular data storage system that uses a particular compression algorithm is expected to achieve a benchmark level of data reduction. The techniques herein may be used to verify and ensure that the foregoing benchmark level of data reduction is achieved for the particular compression algorithm. The benchmark level may be expected for use with data sets having particular characteristics, such as a specified CR and a specified DR.

Due to the precision and control the techniques herein provide in connection with data set generation, the techniques herein may be used to further refine and control other aspects of the generated buffers. For example, assume that buffers of a data set are processed by data reduction processing in the consecutive sequential order in which the buffers are generated using the techniques herein. In this case, the techniques herein may be used to generate a particular sequence of buffers of the first set and the second set to test different aspects of the data reduction code. For example, processing may be performed to control the number of duplicates generated for a particular buffer of the first set. An embodiment may have an upper bound or limit on the number of allowable detected duplicates for a single target block or buffer. The techniques herein may be used to generate a data set that includes the maximum allowable number of duplicates in order to execute the underlying code subject to such conditions. In connection with generating the second set of duplicate buffers, the techniques herein may have the processing of 510 of FIG. 5 simply select the same UST the desired number of times to trigger generation of the desired number of duplicate buffers. Generally, the techniques herein may be used to generate desired data sets where duplicates are generated with a desired temporal locality of reference in the data set.

As another example, an embodiment in accordance with the techniques herein may generate a data set that, if processing sequentially, may test the variability of data reduction for the different sizes of the dedupe cache used to store portions of the dedupe DB or data store. As a simple example, the dedupe cache may hold dedupe DB entries or information for 100 buffers. The techniques herein may generate a sequence of consecutive sequential buffers of the data set, where "I" denotes the position of each buffer in the sequence and where there are at least 2 duplicate buffers in the sequence and the distance or difference between the index I of each duplicate buffer does not exceed 100. If 2 duplicate buffers, B1 and B2, do not appear within a span of 101 consecutive sequential buffers, then the dedupe cache does not retain the information of the first buffer B1 needed to recognize the second buffer B2 as a duplicate of B1. Thus, the techniques herein may be used to purposefully generate a sequence of buffers that triggers various conditions or bounds to be tested for the purposes of then observing the effects of such conditions on the resulting data reduction achieved.

In at least one embodiment, the size of each buffer of the data set generated using the techniques herein may be 4K bytes as described above. Additionally, the size of each block or chunk denoting the granularity for full block deduplication may also be 4K bytes or the size of each generated buffer. However, other embodiments may use different sizes for each generated buffers and block. Furthermore the size of each generated buffer does not have to be the same size as the block level granularity used for full block deduplication.

Figure 6:
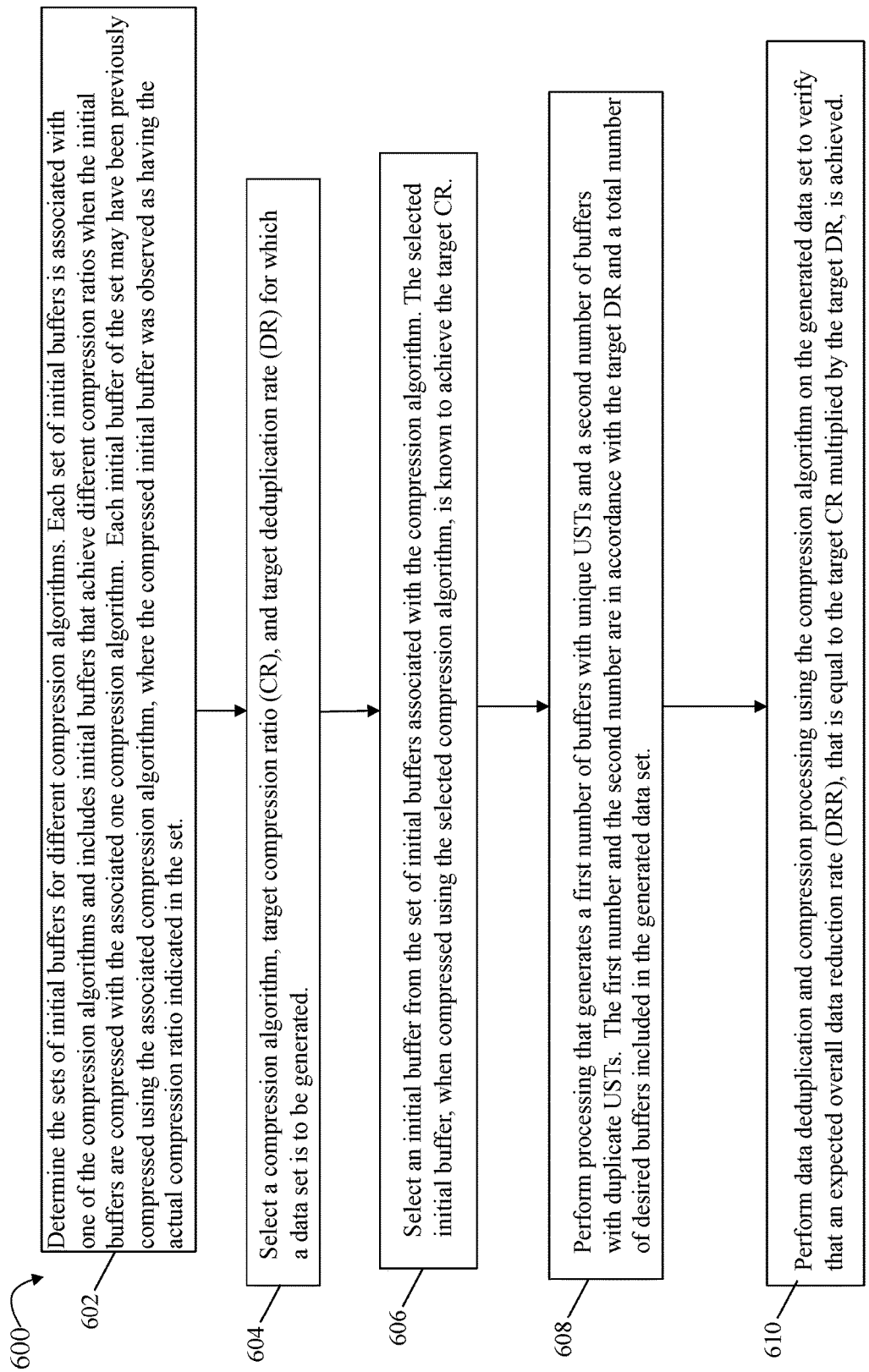
FIGS. 6, 7 and 8 are flowcharts of processing steps that may be performed in an embodiment in accordance with the techniques herein.
Figure 7:
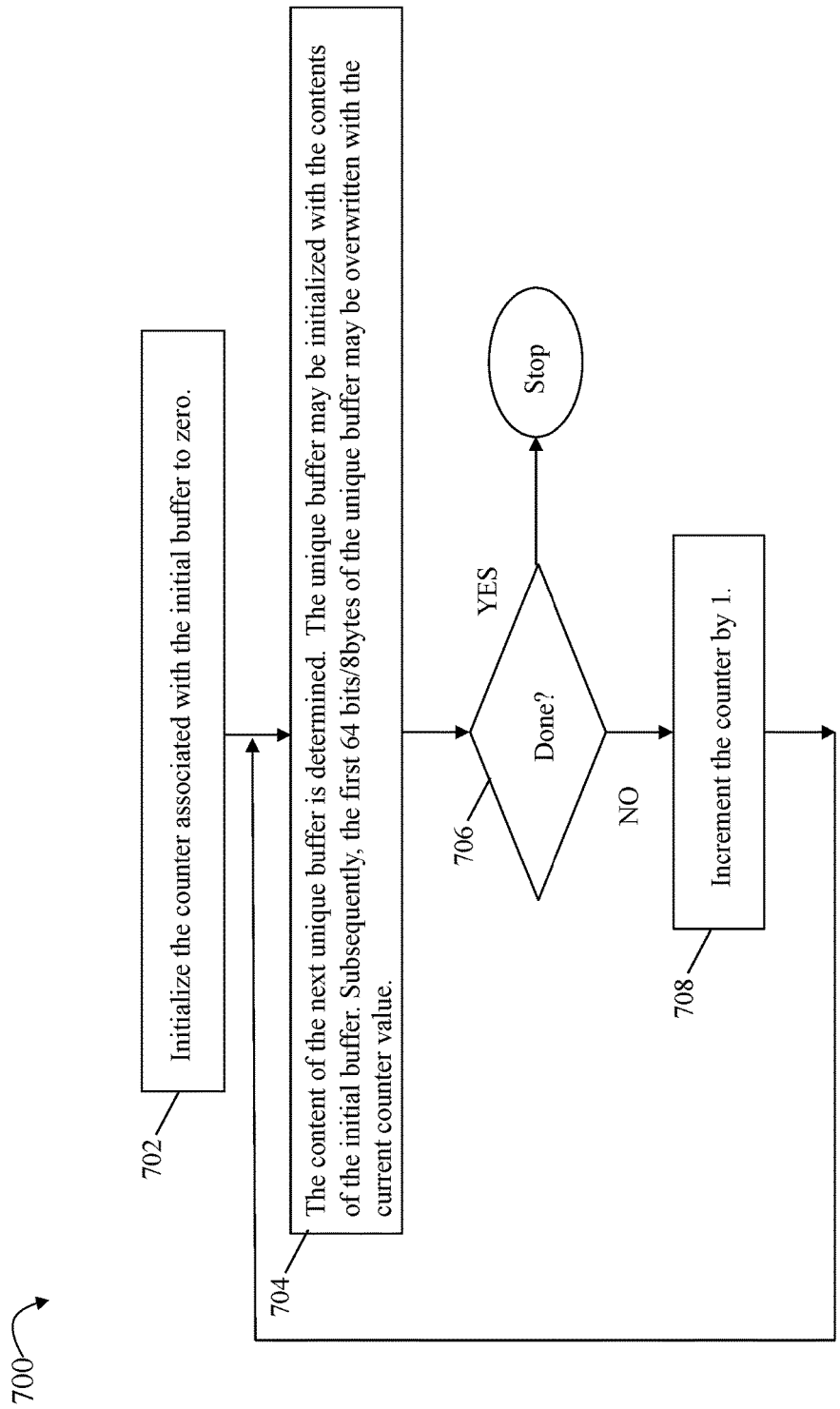
Figure 8:
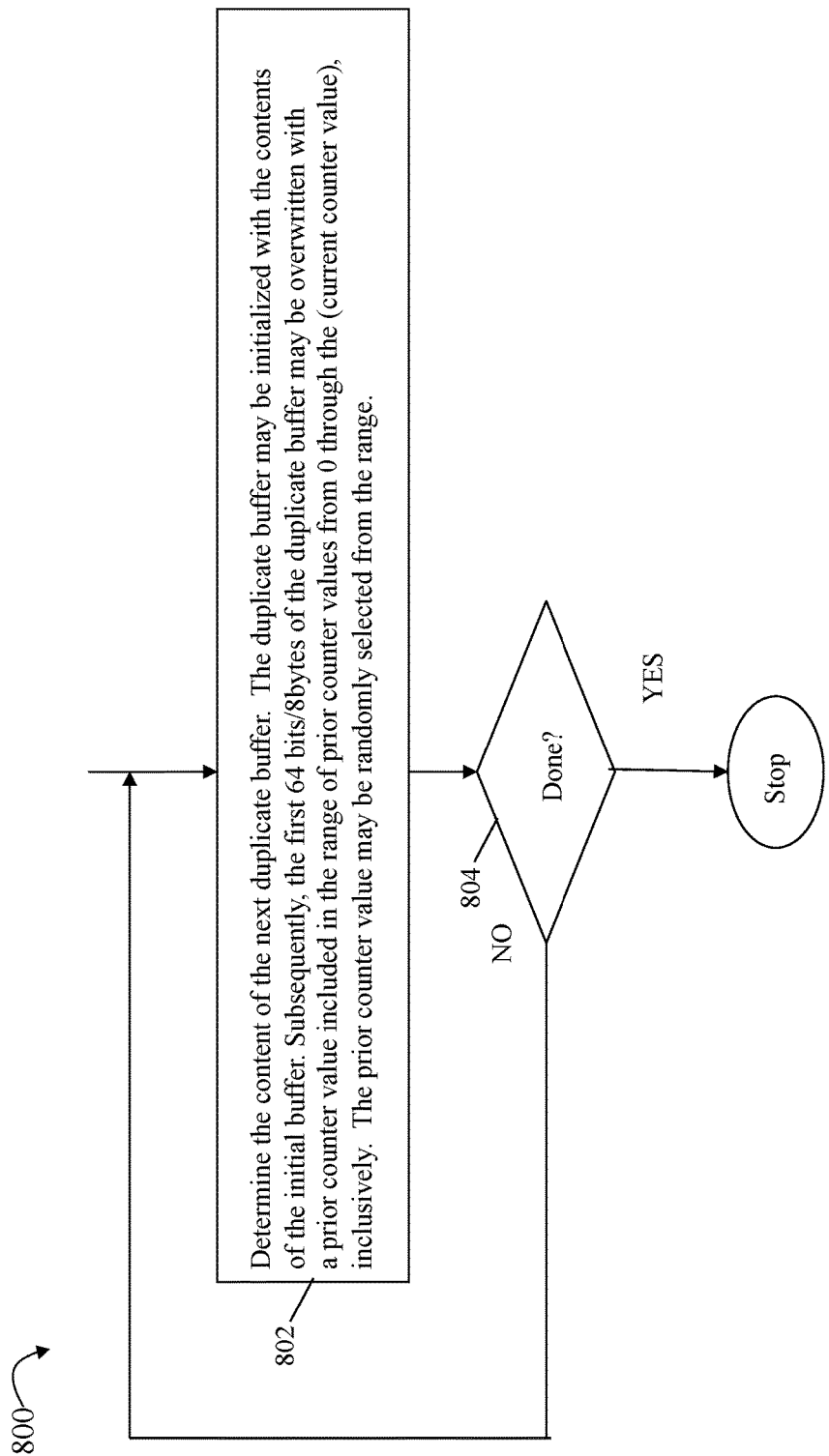

What will now be described in connection with FIGS. 6, 7 and 8 are flowcharts of processing steps that may be performed in an embodiment in accordance with the techniques herein. The flowcharts of the FIGS. 6, 7 and 8 summarize processing described above.

Referring to FIG. 6, shown is a first flowchart 600 of processing steps that may be performed in an embodiment in accordance with the techniques herein.

At the step 602, processing may be performed to determine the sets of initial buffers for different compression algorithms. Each set of initial buffers is associated with one of the compression algorithms and includes initial buffers that achieve different CRs when the initial buffers are compressed with the associated one compression algorithm. Each initial buffer of the set may have been previously compressed using the associated compression algorithm, where the compressed initial buffer was observed as having the actual CR indicated in the set. From the step 602, control proceeds to the step 604.

At the step 604, processing may be performed to select a compression algorithm, a target CR and a target DR for which a data set is to be generated. The compression algorithm selected may be one of the different compression algorithms for which an initial buffer is generated in the step 602. From the step 604, control proceeds to the step 606.

At the step 606, processing is performed to select an initial buffer from the set of initial buffers associated with the compression algorithm. The selected initial buffer, when compressed using the selected compression algorithm, is known to achieve the target CR. From the step 606, control proceeds to the step 608.

At the step 608, processing is performed that generates the first set of buffers and the second set of buffers. In particular, the first set of buffers may be characterized as having unique USTs and may thus denote the unique instances of buffers. The second set of buffers may be characterized as duplicate buffers in that each buffer of the second set is a duplicate of another buffer of the first set. Buffers of the second set include duplicate USTs (i.e., duplicate USTs with respect to original USTs included in buffers of the first set). The first set may include a first number of buffers with unique USTs and the second set may include a second number of buffers with duplicate USTs. The first and second number, and thus the mixture of unique and duplicate buffers, may be determined in accordance with the target DR and a total number of desired buffers included in the generated data set. From the step 608, control proceeds to the step 610.

At the step 610, data deduplication and compression processing may be performed using the compression algorithm on the generated data set to verify that an expected overall DRR, that is equal to the target CR multiplied by the target DR, is achieved. In this manner, the step 610 may verify that the compression algorithm selected in the step 604 has an actual overall DRR that matches (e.g., within specified tolerances or bounds) the expected overall DRR (as theoretically determined as the target CR*target DR, where the target CR and target DR are as specified in the step 604).

The processing of FIG. 6 is described with respect to a single counter associated with the initial buffer selected in the step 606. However, as described elsewhere herein, it is straightforward to use multiple counters in connection with the techniques herein.

Referring to FIG. 7, shown is a second flowchart 700 of processing steps that may be performed in an embodiment in accordance with the techniques herein. The flowchart 700 provides further detail regarding processing that may be performed in connection with generating the first set of buffers having unique USTs. The processing of FIG. 7 is described with respect to a single counter associated with the initial buffer selected in the step 606.

The processing of FIG. 7 provides more detail regarding processing that may be performed in connection with the step 608 of FIG. 6.

At the step 702, the counter associated with the initial buffer is initialized to zero (0). From the step 702, control proceeds to the step 704.

At the step 704, the content of the next unique buffer of the first set is determined. The unique buffer may be initialized with the contents of the initial buffer. Subsequently, the first 64 bits or 8 bytes of the unique buffer may be overwritten with the current counter value. The current counter value may be the unique UST for the buffer. From the step 704, control proceeds to the step 706.

At the step 706, a determination is made as to whether the processing of the flowchart 700 that generates buffers of the first set is done. If the step 706 evaluates to yes, processing stops. If the step 706 evaluates to no, control proceeds to the step 708 where the counter is incremented by 1. From the step 708, control proceeds to the step 704.

Consistent with other discussion herein, the processing of FIG. 7 may be performed as part of one or more cycles or iterations of alternating between generating a portion of buffers of the first set and generating a portion of buffers of the second set using the processing of FIG. 8 (described below). For example, in at least one embodiment, all buffers of the first set may be generated in a single cycle or iteration denoted by the processing of FIG. 7. Subsequently, all buffers of the second set may be generated in a single cycle or iteration denoted by the processing of FIG. 8. As a variation, an embodiment may alternate multiple times between processing of FIGS. 7 and 8 to collectively generate all the desired buffers of the first and second sets.

Referring to FIG. 8, shown is a third flowchart 800 of processing steps that may be performed in an embodiment in accordance with the techniques herein. The flowchart 800 provides further detail regarding processing that may be performed in connection with generating the second set of duplicate buffers having duplicate USTs.

The processing of FIG. 8 provides more detail regarding processing that may be performed in connection with the step 608 of FIG. 6.

At the step 802, processing is performed to construct the next duplicate buffer where the content of the next duplicate buffer is determined. In the step 802, the duplicate buffer may be initialized with the contents of the initial buffer. Subsequently, the first 64 bits or 8 bytes of the duplicate buffer may be overwritten with a prior counter value included in the range of prior counter values from 0 through the current counter value, inclusively. The prior counter value may be randomly selected from the range. The current counter value may denote the MAX UST attained so far in connection with generating unique buffers of the first set in connection with FIG. 7 processing. From the step 802, control proceeds to the step 804 where a determination is made as to whether the processing of the flowchart 800 that generates buffers of the second set is done. If the step 806 evaluates to yes, processing stops. If the step 804 evaluates to no, control proceeds to the step 802.

The techniques herein may be performed by any suitable hardware and/or software. For example, techniques herein may be performed by executing code which is stored on any one or more different forms of computer-readable media, where the code may be executed by one or more processors, for example, such as processors of a computer or other system, an ASIC (application specific integrated circuit), and the like. Computer-readable media may include different forms of volatile (e.g., RAM) and non-volatile (e.g., ROM, flash memory, magnetic or optical disks, or tape) storage which may be removable or non-removable.

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of generating data sets comprising:
    receiving, at a system using a processor, initial data stored in an initial buffer, wherein compressing the initial data, by applying a first compression algorithm using a processor, generates a compressed form of the initial data having a first compression ratio, the initial buffer of the initial data including first content located at a first position in the initial buffer and including second content located at a second position in the initial buffer; and
    generating, using a processor and the initial data, a data set, wherein performing a combination of deduplicating the data set, by performing deduplication processing using a processor, and compressing the data set, by applying the first compression algorithm using a processor, generates a resulting data set that is expected to have a specified deduplication ratio and is expected to have the first compression ratio, wherein said generating the data set using the initial data includes:

generating, using a processor, a first plurality of data stored in a first plurality of buffers, wherein each of the first plurality of buffers is unique with respect to its content and is not a duplicate with respect to content of any another buffer in the first plurality, wherein a counter associated with the initial buffer is set to a first value and the first value is stored at the first position in a first buffer of the first plurality, and wherein the second content of the initial buffer is stored at the second position in the first buffer; and generating, using a processor, a second plurality of data stored in a second plurality of duplicate buffers, wherein each duplicate buffer of the second plurality is a duplicate of data of one of the first plurality of buffers of the data set, wherein a data value stored at the first position of a first duplicate buffer of the second plurality is included in a range of prior counter values of the counter, and wherein each prior counter value in the range is stored at the first position in a different one of the first plurality of buffers.

2. The method of claim 1, wherein the range of prior counter values is from zero (0) to a maximum value, inclusively.

3. The method of claim 1, wherein a total data reduction ratio of the data set as a result of deduplication processing and compression processing using the first compression algorithm is expected to be a mathematical product of the specified deduplication ratio multiplied by the first compression ratio.

4. The method of claim 3, wherein a first number of duplicate buffers in the data set is in accordance with the specified deduplication ratio, and wherein the second plurality of duplicate buffers includes the first number of duplicate buffers.

5. The method of claim 4, wherein N denotes a total number of buffers of data in the data set, wherein the specified deduplication ratio denotes a percentage of the total number of buffers of the data set that are duplicates, wherein the mathematical product of N and the percentage is equal to the first number that denotes a number of buffers of data in the second plurality of duplicate buffers, wherein a second number is equal to the difference between N and the first number, and wherein the second number denotes a number of buffers of data in the first plurality of buffers.

6. The method of claim 1, wherein the data value stored at the first position of a first duplicate buffer of the second plurality is randomly selected from the range of prior counter values of the counter.

7. The method of claim 6, wherein the data value is selected using a pseudo-random number generator.

8. The method of claim 1, wherein the first position of each buffer in the data set corresponds to a plurality of bytes at one end of said each buffer.

9. The method of claim 8, wherein the first position of each buffer in the data set corresponds to 8 bytes located at a beginning of said each buffer.

10. The method of claim 1, wherein said generating the first plurality of data stored in the first plurality of buffers includes:

after generating the first buffer of data of the first plurality, incrementing the counter by one from the first value to a second value;

generating a second buffer of data of the first plurality, wherein the second value of the counter associated with the initial buffer is stored at the first position in the second buffer of the first plurality, and wherein the second content of the initial buffer is stored at the second position in the second buffer;

after generating the second buffer of data of the first plurality, incrementing the counter by one from the second value to a third value; and generating a third buffer of data of the first plurality, wherein the third value of the counter associated with the initial buffer is stored at the first position in the third buffer of the first plurality, and wherein the second content of the initial buffer is stored at the second position in the third buffer.

11. The method of claim 1, wherein the initial buffer is a first initial buffer of a first plurality of initial buffers of data associated with the first compression algorithm, and wherein each of the initial buffers of data in the first plurality of initial buffers, when compressed by applying the first compression algorithm using a processor, generates compressed data having a different compression ratio than any other initial buffer of data in the first plurality of initial buffers.

12. The method of claim 11, wherein a second plurality of initial buffers is associated with a second compression algorithm that is different than the first compression algorithm, and wherein each of the initial buffers of data in the second plurality of initial buffers, when compressed by applying the second compression algorithm using a processor, generates compressed data having a different compression ratio than any other initial buffer of data in the second plurality of initial buffers.

13. The method of claim 12, wherein the first compression algorithm and the second compression algorithm are different compression algorithms selectable for processing performed as part of inline processing of the data path in a data storage system.

14. The method of claim 1, wherein each buffer in the data set is a same size.

15. The method of claim 14, wherein the same size is a value that is at least 4K bytes and wherein the first position of each buffer of the data set corresponds to a same 8 byte region at one end of said each buffer.

16. The method of claim 3, further comprising:

generating the resulting data set as a result of performing, using a processor, data deduplication processing and compression processing with the first compression algorithm on the data set; and verifying that the total data reduction ratio is achieved with respect to the resulting data set and the data set.

17. A system comprising:

one or more processors; and a memory comprising code stored thereon that, when executed, performs a method of generating data sets comprising:

receiving, at a system using a processor, initial data stored in an initial buffer, wherein compressing the initial data, by applying a first compression algorithm using a processor, generates a compressed form of the initial data having a first compression ratio, the initial buffer of the initial data including first content located at a first position in the initial buffer and including second content located at a second position in the initial buffer; and generating, using a processor and the initial data, a data set, wherein performing a combination of deduplicating the data set, by performing deduplication processing using a processor, and compressing the data set, by applying the first compression algorithm using a processor, generates a resulting data set that is expected to have a specified deduplication ratio and is expected to have the first compression ratio, wherein said generating the data set using the initial data includes:

generating, using a processor, a first plurality of data stored in a first plurality of buffers, wherein each of the first plurality of buffers is unique with respect to its content and is not a duplicate with respect to content of any another buffer in the first plurality, wherein a counter associated with the initial buffer is set to a first value and the first value is stored at the first position in a first buffer of the first plurality, and wherein the second content of the initial buffer is stored at the second position in the first buffer; and generating, using a processor, a second plurality of data stored in a second plurality of duplicate buffers, wherein each duplicate buffer of the second plurality is a duplicate of data of one of the first plurality of buffers of the data set, wherein a data value stored at the first position of a first duplicate buffer of the second plurality is included in a range of prior counter values of the counter, and wherein each prior counter value in the range is stored at the first position in a different one of the first plurality of buffers.

18. A non-transitory computer readable medium comprising code stored thereon that, when executed by one or more processors, performs a method of generating data sets comprising:

receiving, at a system, initial data stored in an initial buffer, wherein compressing the initial data, by applying a first compression algorithm using a processor, generates a compressed form of the initial data having a first compression ratio, the initial buffer of the initial data including first content located at a first position in the initial buffer and including second content located at a second position in the initial buffer; and generating, using the initial data, a data set, wherein performing a combination of deduplicating the data set, by performing deduplication processing using a processor, and compressing the data set, by applying the first compression algorithm using a processor, generates a resulting data set that is expected to have a specified deduplication ratio and is expected to have the first compression ratio, wherein said generating the data set using the initial data includes:

generating a first plurality of data stored in a first plurality of buffers, wherein each of the first plurality of buffers is unique with respect to its content and is not a duplicate with respect to content of any another buffer in the first plurality, wherein a counter associated with the initial buffer is set to a first value and the first value is stored at the first position in a first buffer of the first plurality, and wherein the second content of the initial buffer is stored at the second position in the first buffer; and generating a second plurality of data stored in a second plurality of duplicate buffers, wherein each duplicate buffer of the second plurality is a duplicate of data of one of the first plurality of buffers of the data set, wherein a data value stored at the first position of a first duplicate buffer of the second plurality is included in a range of prior counter values of the counter, and wherein each prior counter value in the range is stored at the first position in a different one of the first plurality of buffers.

19. The method of claim 1, wherein the resulting data set is expected to have the specified deduplication ratio, within specified tolerances or bounds, and is expected to have the first compression ratio, within specified tolerances or bounds.

20. The method of claim 16, wherein said verifying includes:

determining an achieved data reduction ratio for the resulting data set;

determining, within specified tolerances or bounds, whether there is a difference between the achieved data reduction ratio and the total data reduction ratio;

responsive to determining within the specified tolerances or bounds that there is no difference between the achieved data reduction ratio and the total data reduction ratio, successfully verifying and validating data reduction processing performed to generate the resulting data set, wherein said data reduction processing includes the data deduplication processing of the data set and the compression processing of the data set by applying the first compression algorithm as performed in said generating the resulting data set; and responsive to determining that there is a difference between the achieved data reduction ratio and the total data reduction ratio and wherein the difference is not within the specified tolerances or bounds, determining that verification and validation of the data reduction processing performed to generate the resulting data set has failed.

21. The method of claim 1, wherein the initial buffer of data, when compressed by applying the first compression algorithm using a processor, generates a compressed initial buffer of data having the first compression ratio, within specified tolerances and bounds.

* * * * *